United States Patent
Blumenthal

(10) Patent No.: US 9,755,753 B2
(45) Date of Patent: Sep. 5, 2017

(54) TUNABLE U-LASER TRANSMITTER WITH INTEGRATED MACH-ZEHNDER MODULATOR

(71) Applicant: OE SOLUTIONS AMERICA, INC., Englewood Cliffs, NJ (US)

(72) Inventor: Daniel Jacob Blumenthal, Santa Barbara, CA (US)

(73) Assignee: OE SOLUTIONS AMERICA, INC., Englewood Cliffs, NJ (US)

( * ) Notice: Subject to any disclaimer, the term of this patent is extended or adjusted under 35 U.S.C. 154(b) by 69 days.

(21) Appl. No.: 14/146,717

(22) Filed: Jan. 2, 2014

(65) Prior Publication Data

US 2015/0333475 A1 Nov. 19, 2015

Related U.S. Application Data

(60) Provisional application No. 61/748,415, filed on Jan. 2, 2013.

(51) Int. Cl.
*H01S 5/00* (2006.01)
*H04B 10/50* (2013.01)
(Continued)

(52) U.S. Cl.
CPC ....... *H04B 10/505* (2013.01); *H01S 3/10061* (2013.01); *H01S 5/0085* (2013.01);
(Continued)

(58) Field of Classification Search
CPC .. H01S 5/0265; H01S 5/1007; H01S 5/06256; H01S 5/1096; H01S 5/0206;
(Continued)

(56) References Cited

U.S. PATENT DOCUMENTS 5,319,667 A 6/1994 Dütting et al.
5,398,256 A 3/1995 Hohimer et al.
(Continued)

FOREIGN PATENT DOCUMENTS

EP 1087478 A1 3/2001
JP 0391278 4/1991
(Continued)

OTHER PUBLICATIONS

English Translation of JP2012-156336.*
(Continued)

*Primary Examiner* — Yuanda Zhang
(74) *Attorney, Agent, or Firm* — Ichthus International Law, PLLC

(57) ABSTRACT

According to the present invention, a monolithically integrated laser 102, also referred to herein as a U-laser 102, or integrated dual optical emission laser 102, having a first optical emission 104 and a second optical emission 106 where both the first and second optical emissions 104, 106 of the monolithically integrated laser 102 are in optical communication with a modulator 108 or other device is provided. The integrated dual emission laser 102 can be formed with a light bending portion 134 in variety of configurations including a waveguide in the form of a U-shape, or total internal reflection (TIR) mirrors, curved waveguides, and free-space etched gap mirrors. The integrated dual optical emission laser 102 can also have two laser gain sections 130, 148, one on each arm of the laser 102 to control gain.

21 Claims, 16 Drawing Sheets

(51) Int. Cl.

| | |
|---|---|
| *H01S 3/10* | (2006.01) |
| *H01S 5/02* | (2006.01) |
| *H01S 5/14* | (2006.01) |
| *H01S 5/026* | (2006.01) |
| *H01S 5/0625* | (2006.01) |
| *H01S 5/10* | (2006.01) |
| *H01S 5/40* | (2006.01) |
| *H01S 3/07* | (2006.01) |
| *H01S 3/105* | (2006.01) |
| *H01S 3/106* | (2006.01) |

(52) U.S. Cl.
CPC ........... *H01S 5/0206* (2013.01); *H01S 5/026* (2013.01); *H01S 5/14* (2013.01); *H01S 5/142* (2013.01); *H01S 3/07* (2013.01); *H01S 3/105* (2013.01); *H01S 3/106* (2013.01); *H01S 5/005* (2013.01); *H01S 5/0265* (2013.01); *H01S 5/06256* (2013.01); *H01S 5/101* (2013.01); *H01S 5/1007* (2013.01); *H01S 5/1032* (2013.01); *H01S 5/1071* (2013.01); *H01S 5/1096* (2013.01); *H01S 5/4012* (2013.01)

(58) Field of Classification Search
CPC .. H01S 3/10061; H01S 5/1003; H01S 5/1092; H01S 5/101; H01S 5/18302
See application file for complete search history.

(56) References Cited

U.S. PATENT DOCUMENTS

| | | | |
|---|---|---|---|
| 2002/0085609 | A1 | 7/2002 | Ksendzov et al. |
| 2002/0186727 | A1 | 12/2002 | Aoki |
| 2004/0207896 | A1 | 10/2004 | Aoki et al. |
| 2005/0265647 | A1* | 12/2005 | Vakhshoori et al. ............. 385/4 |
| 2009/0279576 | A1 | 11/2009 | Joyner et al. |
| 2010/0303469 | A1 | 12/2010 | Barton et al. |
| 2011/0157670 | A1 | 6/2011 | Koch |
| 2012/0314277 | A1* | 12/2012 | Matsuda ............... G02F 1/0123 359/341.1 |
| 2013/0016744 | A1* | 1/2013 | Li et al. .................... 372/20 |
| 2014/0079082 | A1* | 3/2014 | Feng et al. ................. 372/20 |

FOREIGN PATENT DOCUMENTS

| | | |
|---|---|---|
| JP | 0645693 | 2/1994 |
| JP | 2003043430 | 2/2003 |
| JP | 2003177365 | 6/2003 |
| JP | 2005077987 | 3/2005 |
| JP | 2010539818 | 12/2010 |
| JP | 2011253930 | 12/2011 |
| JP | 201298744 | 5/2012 |
| JP | 2012156335 A | 8/2012 |
| JP | 2012156336 | 8/2012 |
| JP | 2012156336 A | 8/2012 |
| WO | 2009036390 | 3/2009 |
| WO | 2011060325 A1 | 5/2011 |
| WO | 2012019290 A1 | 2/2012 |

OTHER PUBLICATIONS

PCT International Search Report for PCT/US2014/010108, mailed May 12, 2014, 3 pages.

Barton, J. S., et al, "Integration of a Mach-Zehnder modulator with Sampled Grating Distributed Bragg Reflector laser," Integrated Photonics Research Conference, paper No. 1FC3-1, Vancouver, Canada, Jul. 17-19, 2002, 3 pages.

Barton, J. S. PhD, Dissertation, "The Integration of Mach-Zehnder Modulators with Sampled Grating DBR Lasers", Sep. 2004, 238 pages.

Barton J.S., et al, "Photonic Integrated Circuits based on Sampled-Grating Distributed-Bragg-Reflector Lasers." Photonic Integrated Systems, Proceedings of SPIE, vol. 4998, 2003, pp. 43-54.

Barton J. S, et al., "Tailorable chirp using Integrated Mach-Zehnder modulators with tunable Sampled Grating Distributed Bragg Reflector lasers." 2002 IEEE 18th International Semiconductor Laser Conference, Conference Digest (Cat. No. 02CH37390). paper No. TuB3, Garmisch, Germany, Sep. 29-Oct. 3, 2002, pp. 49-50.

Bauters, Jared F., et. al., "Ultra-low-loss high-aspect-ratio Si3N4 waveguides," Optics Express, vol. 19, No. 4, Feb. 14, 2011, pp. 3163-3174.

Liang, D., et. al., "Electrically-pumped compact hybrid silicon microring lasers for optical interconnects," Optics Express, vol. 17, No. 22, Oct. 2009, pp. 20355-20364.

Liang, Di et al., "Recent progress in lasers on silicon," Nature Photonics, No. 4, Aug. 2010, pp. 511-517.

Lovisa, S., et al., "Integrated Laser Mach-Zehnder Modulator on Indium Phosphide Free of Modulated-Feedback," IEEE Photonics Technology Letters, vol. 13, No. 12, Dec. 2001, pp. 1295-1297.

Nicholes, S. C. et. al., "An 8×8 InP Monolithic Tunable Optical Router (MOTOR) Packet Forwarding Chip," Journal of Lightwave Technology, vol. 28, No. 4, Feb. 15, 2010, pp. 641-650.

Paniccia, M., "Integrating silicon photonics," Nature Photonics, www.nature.com/naturephotonics; vol. 4, Aug. 2010, pp. 498-499.

Penninckx, D., et al., "Comparison of the Propagation Performance Over Standard Dispersive Fiber Between InP-Based π-Phase• Shifted and Symmetrical Mach-Zehnder Modulators," IEEE Photonics Technology Letters, vol. 9, No. 9, Sep. 1997, pp. 1250-1252.

Raring, J. W. et al., "Widely Tunable Negative-Chirp SG-DBR Laser/EA-Modulated Transmitter," Journal of Lightwave Technoly., vol. 23, No. 1, Jan. 2005, pp. 80-86.

Reid, D.C.J. et al., "A novel broadband DBR laser for DWDM networks with simplified quasi-digital wavelength selection," Optical Fiber Communication Conference and Exhibit, Mar. 17-22, 2002, pp. 541-543.

Rigole, P. et al., "Access to 20 Evenly Distributed Wavelengths Over 100 nm Using Only a Single Current Tuning in a Four-Electrode Monlithic Semiconductor Laser," IEEE Photon. Technol. Lett., vol. 7, Nov. 1995, pp. 1249-1251.

Rolland, C., "InGaAsP-based Mach-Zehnder modulators for high• speed transmission systems," Optical Fiber Communication Conference and Exhibit, 1998, Technical Digest, Feb. 22-27, 1998, pp. 283-284.

Rolland, C., et al., "10 Gb/s, 120km normal fiber transmission experiment using a 1.56 µm Muliple Quantum Well InP/InGaAsP Mach-Zehnder modulator", OFC/OOC 1993, pp. 378-379.

Rolland, et al, "10 Gbit/s, 1.56 µm Multiquantum Well InP.InGaAsP Mach-Zehnder Optical Modulator," Electronics Letters, vol. 29, No. 5, pp. 471-472, Mar. 4, 1993.

Adam, D. M. et al. "Mach-Zehnder modulator integrated with a gain-coupled DFB laser for 10 Gbit/s, 100 km NDSF transmission at 1.55 µm," Electron. Lett., Feb. 29, 1996, vol. 32, No. 5, pp. 485-486.

Alculova, Y.A. et al.; Widely Tunable Electroabsorption-Modulated Sampled-Grating DBR Laser Transmitter, IEEE Journal of Selected Topics in Quantum Electronics, vol. 8, No. 6, Nov.-Dec. 2002, pp. 1349-1357.

Anderson, K.; Betty, I.; Indium Phosphide MZ chips are suited to long-reach metro, Laser Focus World, vol. 39 Issue: 3, Mar. 2003, pp. 101-104.

Cartledge, J. C. et al., "Comparative Performance of Lightwave Systems Using Electro-Absorption Modulators and Semiconductor Mach-Zehnder Modulators," Proc LEOS'96, Boston, MA, 1996, paper WWI, pp. 170-171.

Cartledge, J. C. et al., "Theoretical Performance of 10 Gb/s Lightwave Systems Using a III-V Semiconductor Mach-Zehnder Modulator," IEEE Photon. Technol. Lett., vol. 6, No. 2, pp. 282-284.

Delansay, Ph., et al., "10 Gbit/s transmission over 90-127 km in the wavelength range 1530-1560 nm using an InP-based Mach-Zehnder modulator," Electron. Lett., vol. 32, No. 19, pp. 1820-1821, Sep. 12, 1996.

Delansay, Ph. et al., "InP/GaInAsP phase-shifted Mach-Zehnder modulator for wavelength-independent (1530-1560 nm) performance in 10 Gbit/s transmission over dispersive fiber," Proc. Conf. Optical Fiber Commun., Dallas, TX, 1997, paper TuD1.

(56) References Cited

OTHER PUBLICATIONS

Delorme, F. et al., "Buttjointed DBR laser with 15 nm tunability grown in three MOVPE steps," Electronic Letters, vol. 31, No. 15, pp. 1244-1245, Jul. 20, 1995.

Guillemot, C. et al., "Transparent optical packet switching: The European ACTS KEOPS project approach," J. Lightw. Technol., vol. 16, No. 12, pp. 2117-2134, Dec. 1998.

Hoon, Kim; et al., "Chirp Characteristics of Dual-Drive. Mach•Zehnder Modulator With a Finite DC Extinction Ratio," Photonics Technology Letters, IEEE, vol. 14 Issue: 3, Mar. 2002, pp. 298-300.

Ishii,H. et al., "Multiplephase Shift Super Structure Grating DBR Lasers for Broad Wwavelength Tuning," IEEE Photon. Technol. Lett., vol. 5, No. 6, pp. 613-615, Jun. 1993.

Ishii, H., et al, "Quasicontinuous Wavelength Tuning in Super-Structure-Ggrating (SSG) DBR Lasers," IEEE Journal of Quantum Electronics, vol. 32, No. 3, pp. 433-441, Mar. 1996.

Jayaraman,V, et al., "Theory, Design, and Performance of Extended Tuning Range Semiconductor Lasers with Sampled Gratings," IEEE Journal of Quantum Electronics, vol. 29, No. 6, pp. 1824-1834, Jun. 1993.

Kano, Y. et al., "Frequency control and stabilization of broadly tunable SSG-DBR lasers," in Proc. Opt. Fiber Commun. Conf., 2002, pp. 538 540.

Lawetz, C.; et al., Modulation Characteristics of Semiconductor Mach-Zehnder Optical Modulators, Journal of Lightwave Technology, vol. 15, No. 4, Apr. 1997, pp. 697-703.

Mason, B. et al., "Design of Sampled Grating DBR Lasers with Integrated Semiconductor Optical Amplifiers," IEEE Photon. Technol. Lett., vol. 12, No. 7, pp. 762-764, Jul. 2000.

Matsuo, S., et al., "Widely tunable laser using microring resonators," in Proc. 20th IEEE Int. Semicond. Laser Conf. (ISLC 2006), pp. 21-22, Paper TuB2.

Matsuo, S., et al., "Integrated Filtered Feedback Tunable Laser using Double-RIng-Resonator-Coupled Filter," in Proc. 21st IEEE Int. Semicond. Laser Conf. (ISLC 2008), Paper WB7, pp. 155-156.

Muller, M,; et al., 1.3-μm Continuously Tunable Distributed Feedback Laser with Constant Power Output Based on GainNAs-GaAs, Photonics Technology Letters, IEEE, vol. 15 No. 7, Jul. 2003, pp. 897-899.

Sano, H., et al., "High-speed InGaAs/InAlAs MQW Mach-Zehnder-type optical modulator", OFC/IOOC '93 Technical Digest, pp. 215-217.

Sasayama, K. et al., "FRONTIERNET: Frequency-Routing-Type Time-Division Interconnection network," Journal of Lightwave Technology, vol. 15, No. 3, Mar. 1997, pp. 417-429.

Segawa, T. et al, "Full C-Band Tuning Operation of Semiconductor Double Ring Resonator Coupled Laser With Low Turning Current," IEEE Photonics Technology Letters, vol. 19, No. 17, Sep. 2007, pp. 1322-1324.

Segawa, T. et al., "Tunable Double-ring-resonator-coupled Laser over Full C-band with Low Tuning Current," in Proc. 19th Indium Phosphide Related Mater. Conf. (IPRM May 2007), pp. 598-601.

Segawa, T. et al.,"Monolithically Integrated Filter-Free Wavelength Converter With Widely Tunable Double-Ring Resonator Coupled Laser," in Proc. 20th Indium Phosphide Related Mater. Conf. (IPRM 2008), Versailles, Fran~ce, Paper TuA1.2,4 pages.

Shibata, Y. et al. "Monolithically Integrated Parallel-Amplifier Structure For Filter-Free Wavelength Conversion," Jpn. J. Appl. Phys., vol. 41, Feb. 2002, pp. 1194-1198.

Summers, Joseph A. et al., "Concave Low-Loss Total Internal Reflection Mirrors in Indium Phosphide for High Fabrication Tolerance," Conference Paper, Conference on Lasers and Electro-Optics, Baltimore, Maryland, May 6, 2007, Integrated Optics (CTuH), 2 pages.

Todt, R. et al., "Demonstration of Vernier effect tuning in tunable twin-guide laser diodes," Proc. Inst. Electr. Eng. Optoelectron., vol. 152, No. 2, 2005, pp. 66-71.

Wesstrom, J. et al., "Design of a Widely Tunable Modulated Ggrating Y-branch Laser using the Additive Vernier Effect for Improved Super-Mode Selection," in Proc. 18th Int. Semicond. Laser Conf. (ISLC), 2002, pp. 99-100.

Xun Li; et al., "Modeling and Design of a DFB Laser Integrated with a Mach-Zehnder Modulator," IEEE Journal of Quantum Electronics, vol. 34 Issue: 10, Oct. 1998, pp. 1807-1815.

Yamashita, S. et al., "High-performance single-frequency fibre Fabry-Perot laser (FFPL) with self-injection locking," Electronics Letters, vol. 35, No. 22, Oct. 28, 1999, pp. 1952-1954.

Yu, J. et al., "Phase•Engineered III-V MQW Mach-Zehnder Modulators," IEEE Photonics Technology Letters, vol. 8 No. 8, Aug. 1996, pp. 1018-1020.

Zucker, J.E., "Monolithically Integrated ILaser/Mach-Zehnder Modulators Using Quantum Wells, Lasers and Electro-Optics," Society Annual Meeting, LEOS '93 Conference Proceedings. IEEE, Nov. 15-18, 1993, pp. 641-642.

Zucker, J. E., et al., "Quantum Well Interferometric Modulator Monolithically Integrated With 1.55 Full Tunable Distributed Bragg Reflector Laser," Electronics Letters, vol. 28, No. 20, Sep. 24, 1992, pp. 1888-1889.

Notice of Reasons for Rejection from JPO, dated Jul. 26, 2016. Partial Informal English Translation.

Extended Search Report dated Aug. 3, 2016 in European Patent Application No. 14735168.8, 10 pgs.

* cited by examiner

TUNABLE U-LASER TRANSMITTER WITH INTEGRATED MACH-ZEHNDER MODULATOR

CROSS-REFERENCE TO RELATED APPLICATIONS

This Application claims the benefit of U.S. Provisional Patent Application No. 61/748,415 filed Jan. 2, 2013 the contents of which is incorporated herein by reference in its entirety.

BACKGROUND

Today's fiber optic based networks use transceivers as the interface between electronics and optical signals that propagate on the optical fiber and at other points in the network where information is converted between electronic form and optical form. Two critical subsystems of a transceiver are the optical transmitter and the optical receiver. The wavelength of the light emitted from the optical transmitter, and in certain cases used in the optical receiver, is an important parameter used towards designing, constructing and operating fiber optic links, transmission systems and networks. Today's fiber optic transmitters and some coherent optical receivers predominately use lasers that emit light at a fixed wavelength. Employing lasers with the capability to tune the emission optical wavelength addresses under the control of an electronic control signal or set of signals solves many issues that exist today with links and networks that use fixed wavelength transmitters and receivers. Additionally, widely tunable wavelength semiconductor lasers that can be tuned over large wavelength ranges are a key component for today's and future optical communications systems and networks to reduce cost of designing, building, operating and maintaining and increasing the flexibility of such links and networks. There are many advantages to using a widely tunable laser over fixed wavelength laser, namely, one laser can be used as a single part number for a build of materials to construct a network that uses many wavelengths or to replace one of many different wavelength lasers in the field instead of requiring a spare laser for each wavelength to be kept in stock. Widely tunable typically refers to a large tuning range $\Delta\lambda$ relative to the wavelength of operation $\lambda$, such that $\Delta\lambda/\lambda$ is as large as possible. For example in a $\lambda=1550$ nm communication system, a $\Delta\lambda$ tuning of approximately 20 nm to over 100 nm would be considered widely tunable for today's applications. Tunable lasers also allow more flexibility in designing the transmission or optical network system potentially lowering costs in the planning and build-out stages of network deployment. In order to make tunable lasers and tunable optical transmitters cost, power and size or density efficient, monolithic integration of the tunable laser and a subset or all of the associated transmitter or receiver elements using a monolithic substrate like a semiconductor, is required and also leads to improved performance and reliability, all key factors in today's fiber communications systems and networks.

An integrated widely tunable laser typically consists of multiple sections, generally including a gain section, a tunable phase section, and tunable mirror sections and in some designs a tunable filter section is also incorporated. Tuning the physical parameters of these sections is achieved using electrical control signals, thermal tuning or some other mechanism that changes the refractive index or other property of the laser elements, and results in tuning of the output laser wavelength. It is desirable to integrate additional elements with the laser to perform key functions associated with wavelength tuning, for example, power monitors and optical amplifiers to boost signal power and maintain constant power with optical power gain control loops as the wavelength is tuned as well as elements to control elements to lock the tunable wavelength (or frequency) to a desired stability and accuracy or preset standardized frequency grid. One class of tunable lasers utilizes mirrors with periodic reflection peaks (periodic in wavelength or optical frequency) where the two mirrors reflection periods are not spaced with the same periodicity, and tuning is achieved when one of the peaks of each mirror overlap known as the Vernier effect and the laser optical emission occurs predominately at the wavelength where the mirror reflection peaks overlap. It is also necessary that the optical gain inside the laser cavity is properly aligned with the location of the mirror reflectivity peaks and the overlapping tuning wavelength in order to ensure emission at the desired wavelength. Techniques to measure, characterize, monitor and control the gain and mirrors are critical in realizing practical tunable lasers and transmitters that can be manufactured at low cost. The Vernier effect has provided excellent performance characteristics in terms of the quality of the output optical wavelength and can be achieved with a variety of mirror structures including sampled grating reflectors, coupled ring resonators, etc. Performance characteristics that are critical in wavelength division multiplexed applications and high capacity links include single frequency (wavelength) mode operation where the quality of single frequency is defined by parameters like the side mode suppression ratio (SMSR) and in cases where coherent transmission is employed, by the line width of the laser output. In widely tunable lasers, the laser must be tuned over 10s of nanometers range, for example 30-40 nanometers to cover transmission bands used in engineering and operating wavelength multiplexed fiber links, for example the C-band, and in other cases over 40 to 100 nm and over 100 nm tuning is desirable. In prior state of the art, tunable lasers are generally designed so that the maximum power can be extracted from one of the laser mirrors, the primary output mirror, which is connected to the additional elements and the optical fiber. For example in a transmitter, these additional elements include an optical amplifier, an optical modulator, optical waveguides, monitor photodiodes, wavelength locking optics, and the optical fiber. In a receiver these elements coupled to the primary output mirror of the tunable laser may include an optical amplifier, an optical mixer, photodiodes and an optical fiber. In prior art, the requirement to extract maximum optical power from one of the mirrors in order to maximize power into a modulator, optical fiber or other element, leads to tradeoffs in the mirror designs and overall laser tuning design and laser characteristics. For example, maximum power out from a primary mirror requires a decrease in peak mirror reflectivity for the primary output mirror. This results in laser performance tradeoffs including a decrease in the side mode suppression ratio (SMSR) and decrease in the wavelength tuning selectivity and wavelength stability and possibly laser line width. The flatness (or slow roll off) of the periodic wavelength reflection peaks is another important parameter that is critical to achieving wide range tenability. Optimizing these parameters, as well as other parameters, is critical to meeting optical link and network performance requirements while providing low cost, low power, small size and high reliability tunable lasers and transmitters.

For communications applications, it is desirable to make a higher-level building block called the tunable optical transmitter by integrating the tunable laser with an optical data modulator. Different types of optical data modulators are used depending on the performance and application and generally fall into the non-coherent and coherent categories. Integration of these two components, potentially with other components, results in decrease in cost, size, yield per wafer, transmitter power dissipation, and increased transmitted output power as well as other desired optical transmission properties. Monolithic integration of the widely tunable laser with an optical data modulator can be accomplished on the same common semiconductor substrate like indium phosphide or silicon. Other types of laser-modulator integration utilize hybrid integration techniques where the laser, optical amplifier, and data modulator are placed onto a common waveguide communication substrate or interposer made of a suitable material like glass, silicon or silica nitride.

It is desirable when constructing coherent optical communications systems to also integrate the tunable laser into the optical receiver and if possible integrate the coherent optical transmitter and receiver together.

The choice of both the tunable laser design and optical data modulator design are important in the manufacturing and characterization process of tunable transmitters and receivers, determining how the resulting wavelength tunable transmitter will perform in a fiber optic link or network and how well the laser and modulator can be integrated to reduce cost, power dissipation, size without sacrificing reliability and also maintaining required system performance. Additionally the choice of tunable laser design is important in integration of a coherent optical receiver and integration of an tunable optical transmitter and receiver together.

The more successful monolithically integrated widely tunable lasers utilize a linear arrangement of front and rear mirrors, gain section, phase tuning section, and power measurement electrodes. Other designs arrange the mirrors in Y-branches with a common output waveguide and similar mirror, gain section and phase section-tuning elements. The Y-branch configurations have utilized sampled grating mirrors like the linear designs or ring resonators as the mirrors in the Y-section of the laser and a broadband non-tunable reflector at the primary optical emission output located on the single arm portion of the Y. Both designs may contain additional optical filter elements that may also be tunable.

For data modulators, the semiconductor Mach-Zehnder Modulator (MZM) is a preferred modulator design due to the ability to integrate it with the tunable laser, optical data modulation characteristics, low electrical drive voltage requirements, compact size and programmable transmission characteristics. In prior art, integrated transmitters are fabricated by coupling light from the primary laser output mirror (the higher output power mirror via a single waveguide to the modulator input). In the case of a MZM, the modulator input is split into two optical waveguide paths (called arms) and then combined into a common data modulated output waveguide and a secondary waveguide that can be used for optical monitoring. Data is modulated onto the tunable laser output by driving one or both of the MZM paths (arms) with an electronic data signal that affects the physical properties of the MZM waveguides via electrical electrodes or interconnects. This prior state of the art approach, where the input to the MZM requires the power to be split leads to performance tradeoffs, design tradeoffs, and increased susceptibility to fabrication and environmental variations. Examples of transmitter characteristics that are required and lead to tradeoffs include operation over the wide laser wavelength tuning range and required range of temperature and environmental conditions, laser chirp, modulator drive voltage and optical data extinction ratio, output power and signal to noise ratio.

There are multiple problems with prior tunable lasers that utilize a single primary mirror output and integrated laser-MZM transmitters. For the laser these problems include for example optical frequency output quality, difficulty in measuring mirror and laser output characteristics in a manufacturing environment, expensive and complex laser output characterization and programming methods, and increased cost and complexity in reliability and testing. When the laser and modulator are integrated, problems associated with prior tunable lasers that utilize a single primary output mirror connected to the MZM directly or through other optical elements include non-balanced power splitting that occurs in elements like power splitters due to fabrication tolerances, temperature or other environmental or fabrication variations.

Therefore, there is a need for a tunable laser that simplifies characterization, testing and calibration in a manufacturable manner and that works in combination with an integrated optical data modulator that is able to achieve optimal operating and transmission performance with minimal design, operating, and reliability tradeoffs.

SUMMARY

According to the present invention, a monolithically integrated laser comprising an integrated dual emission laser having a first optical emission and a second optical emission is provided. Both the first and second optical emissions of the integrated dual emission laser are in optical communication with a modulator or other optical device. The integrated dual emission laser is formed with a light bending section, such as a waveguide in the form of a U-shape, a set of total internal reflection (TIR) mirrors, or an integrated dual emission laser having two or more laser gain sections.

Preferably, the first and second optical emissions of the integrated dual emission laser make more efficient use of the generated optical emissions that a single output laser, and the modulator or other optical device does not use multimode interference power splitters/couplers or other splitters/combiners.

In other preferred embodiments, the modulator has two arm paths and the wavelength distance difference from the integrated dual emission laser results in the advantage of introducing a differential phase shift between the two arm paths.

In another preferred embodiment, the integrated dual emission laser is formed with a light bending section comprising set of total internal reflection (TIR) mirrors and the reflection characteristics of both mirrors is measurable at an output of the modulator output.

In another preferred embodiment, the integrated dual emission laser has an angled waveguide which is used to minimize reflections at an optical emission facet and reduce requirements of an anti-reflection coating at the optical emission output. Also preferably, the integrated dual emission laser is one of a tunable resonant ring laser, a Y-laser, or a two amplitude and phase locked tunable lasers.

According to another embodiment, a monolithically integrated laser which is nested between two modulators is provided. According to this embodiment, an integrated dual emission laser having a first optical emission and a second optical emission is provided, where the first optical emission of the integrated dual emission laser is in optical communication with a first modulator, and the first modulator is in communication with a first output. The second optical emission of the integrated dual emission laser is in optical communication with a second modulator, and the second modulator is in communication with a second output. In a preferred embodiment, the one of the first or second modulators is a coherent nested modulator.

DRAWINGS

These and other features, aspects and advantages of the present invention will become better understood from the following description, appended claims, and accompanying figures where:

Figure 15:
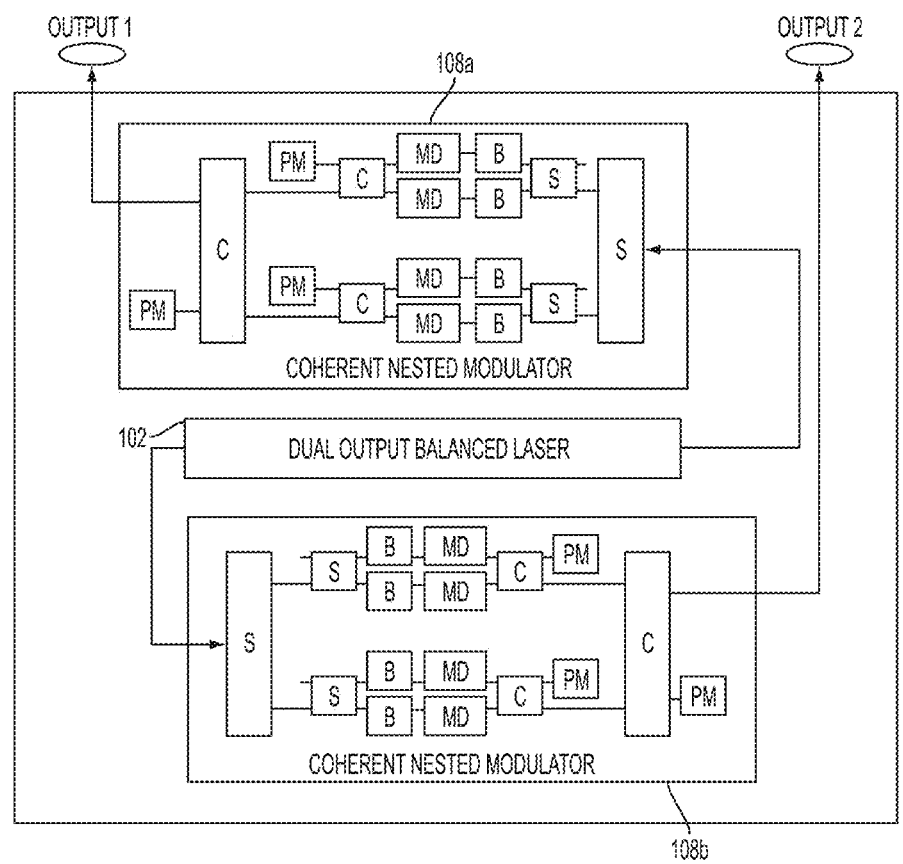
Figure 16:
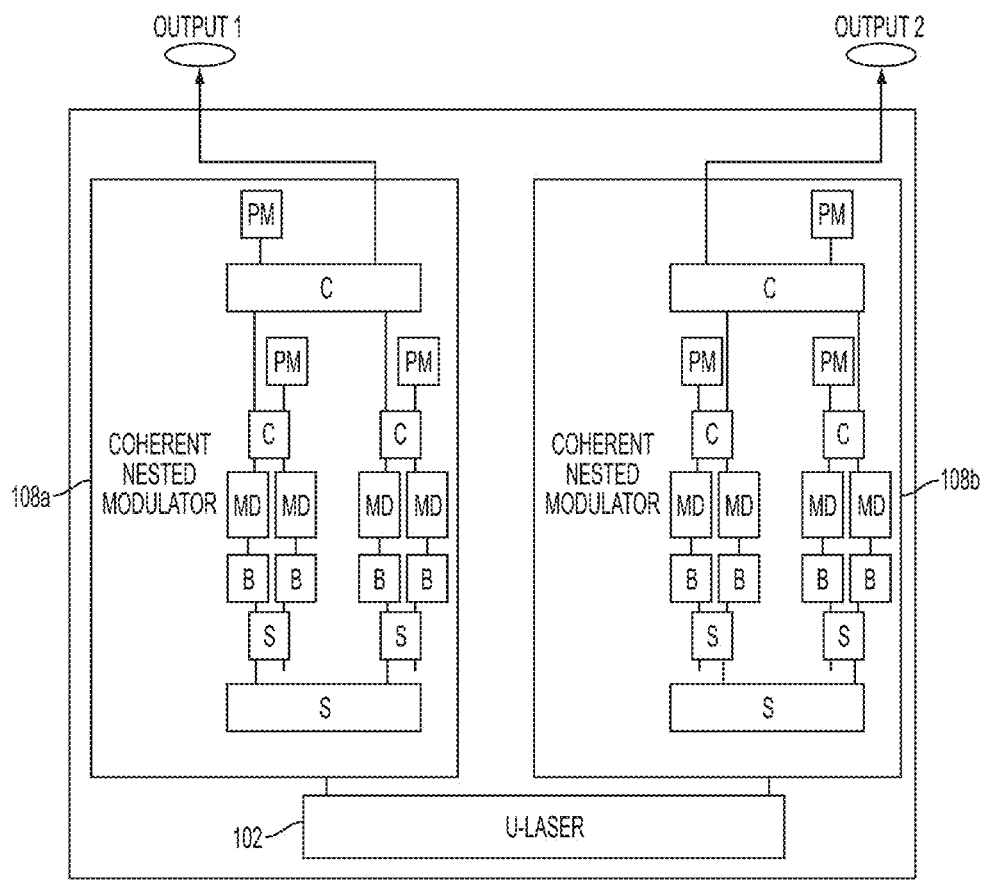

FIG. 15 is a schematic illustration of a dual output balanced widely tunable coherent optical data transmitter comprising the tunable U-laser and coherent nested modulators according to another embodiment of the present invention; and FIG. 16 is a schematic illustration of a widely tunable coherent optical data transmitter comprising the U-laser and coherent nested modulators according to another embodiment of the present invention.

DESCRIPTION

Methods and devices that implement the embodiments of the various features of the invention will now be described with reference to the drawings. The drawings and the associated descriptions are provided to illustrate embodiments of the invention and not to limit the scope of the invention. Reference in the specification to "one embodiment" or "an embodiment" is intended to indicate that a particular feature, structure, or characteristic described in connection with the embodiment is included in at least an embodiment of the invention. The appearances of the phrase "in one embodiment" or "an embodiment" in various places in the specification are not necessarily all referring to the same embodiment.

Systems and methods that enable a widely tunable optical transmitter capable of generating optical signals with simple intensity modulated or advanced modulation formats will be beneficial in optical transmission systems and networks. Example embodiments described herein have several features, no single one of which is indispensible or solely responsible for their desirable attributes. Without limiting the scope of the claims, some of the advantageous features will now be summarized.

Various embodiments of the U-laser, the optical data modulator and the combination of the two in addition to other control and monitoring elements to form an integrated optical transmitter described herein comprise a common substrate for integration, for example but not limited to III-V composite semiconductors, silicon photonics platforms that utilize silicon or combinations of silicon and III-V materials, or other common substrate platforms that utilize glass and silicon nitride. Various embodiments comprising a III-V material such as Indium Phosphide and one or more epitaxial layers, for example InP, InGaAs, InGaAsP, InAlGaAs etc. comprise the U-Laser formed on the common substrate in the epitaxial structure and one or more modulator structures comprising a plurality of arms or branches and at least two electrodes formed on the common substrate. The one or more modulator structures may be configured to modulate the intensity, amplitude, the phase, or both amplitude and phase of optical radiation emitted from the outputs of the U-laser. In various embodiments, for example the Mach-Zehnder Modulator (MZM), the modulator structures may modulate light in accordance with the principles of optical interference. In some embodiments, the modulator structures may be positioned external to the laser cavity and be optically connected to the laser optical emission outputs. In various embodiments, the various components of the optical transmitter such as waveguides, photonic components, splitters, etc. can be formed in the same epitaxial structure as the epitaxial structure in which the laser and modulator are formed. In some embodiments the components of the optical transmitter such as waveguides, bulk photonic components, optical isolators, detectors, splitters, wavelength lockers, power monitors, etc. can be formed in one or more epitaxial structures that are different from the epitaxial structure in which the laser is formed or using bulk optical elements that are connected to the laser and modulator monolithically integrated on the common substrate.

As used in this disclosure, except where the context requires otherwise, the term "comprise" and variations of the term, such as "comprising", "comprises" and "comprised" are not intended to exclude other additives, components, integers or steps.

In the following description, specific details are given to provide a thorough understanding of the embodiments. However, it will be understood by one of ordinary skill in the art that the embodiments may be practiced without these specific detail. Well-known circuits, structures and techniques may not be shown in detail in order not to obscure the embodiments. For example, circuits may be shown in block diagrams in order not to obscure the embodiments in unnecessary detail.

In the following description, specific details are given regarding the inventions, which are a U-laser and modulator. Each invention may be used with the other, and other modulators and/or lasers may be used as well with the corresponding inventions. Various embodiments described herein include a compact optical transmitter having a reduced die size and aspect ratio over prior state of the art, improved laser performance, improved methods to measure, characterize and monitor attributes of the laser, improved methods to qualify the parameters of fabricated lasers, improved methods to calibrate widely tunable lasers and modulators and transmitters, improved methods to conduct burn-n and reliability testing of tunable lasers integrated with modulators into transmitters, and improved method to reduce cost and increase yield in a manufacturable environment over that possible with prior state of the art.

U-Laser

Figure 1:
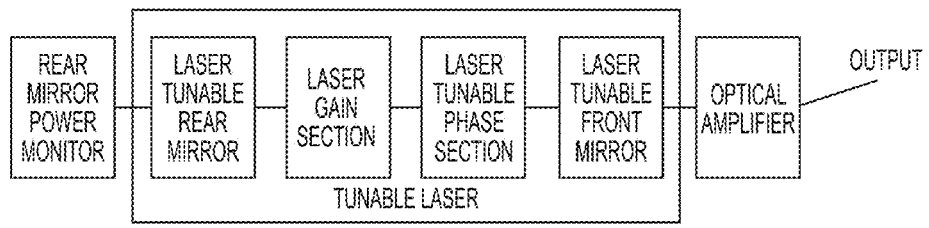
FIG. 1 is a schematic illustration of an exemplary prior art device having a multi-section monolithically integrated tunable laser with light derived from a primary mirror output.

Lasers are well-known in the art as described in U.S. Pat. Nos. 6,628,690 and 7,633,988, herein incorporated by reference in their entirety. FIG. 1 shows an example of prior state of the art in a multi-section monolithically integrated tunable laser with light derived from a primary mirror output. The sections are arranged in a linear fashion with the laser consisting of a tunable rear mirror, a gain section, a tunable phase section, and a tunable front mirror with each section connected by optical waveguides and metal electrodes connected to the top of each section to tune that section. The tunable rear mirror is designed to be highly reflective and is typically connected by a waveguide to a power monitor that also absorbs light from the rear mirror to minimize reflections back into the laser. The front mirror is designed to be less reflective than the rear mirror in order to extract the maximum power from the laser output, and may be connected by a waveguide to an optical amplifier and then to a waveguide that brings the light to a modulator or off chip. In the case of bringing the light off chip, as shown in FIG. 1, an angled waveguide is used to minimize reflections at the chip facet and reduce requirements on the anti-reflection coating at the optical output of the chip. Other known disadvantages of the prior art are that since only one laser output is optically available to test instrumentation, characterization and measurement of optical parameters related to both the front mirror and rear mirror in a manufacturable environment is difficult and prohibitive. For example, measuring the front and rear mirror reflection spectra relative to desired design requirements, measurement of the tuning of the two mirror spectra and changes in the front and rear mirror spectra with temperature, aging, burn-in and other factors like gain and phase section changes are difficult in prior art devices.

Figure 2:
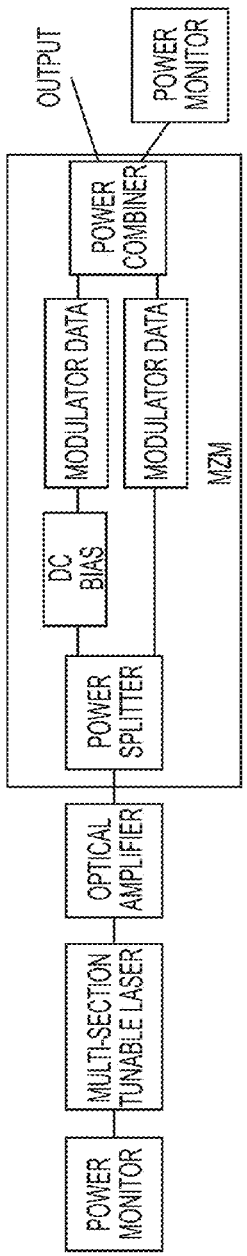
FIG. 2 is a schematic illustration of an exemplary prior art device having integration of a tunable laser with an MZM optical modulator.

Referring now to FIG. 2, an example of a prior art integrated tunable laser with an MZM optical modulator is shown. As in FIG. 1, the rear mirror of the tunable laser is designed to be highly reflective and connect via a linear waveguide to a power monitor. The front of the tunable laser, the primary laser output, is designed to be lower reflectivity in order to communicate maximum optical from the laser to the modulator. The primary laser output is connected via a linear waveguide to an optical amplifier, and a linear waveguide connects to the input of an MZM optical data modulator. At the MZM input, an optical power splitter is used to equally split the light into the two arms of the MZM. Equal power splitting at this first element is critical for optimal modulator operation including high extinction ratio (ER). Electrical data is used to impress data onto the tunable laser emission and to control other aspects of the modulator, often using an upper arm RF connection for non-inverted data and a lower arm RF connection for inverted data (data_bar) and a separate DC bias to adjust the phase and power to be equal and aligned in the two modulator arms. The modulator data and data_bar are used to differentially drive the modulator with the electrical data resulting in a total drive voltage that is lower than driving a single arm of the modulator only. Additionally, the modulator upper and lower arms can have independent voltage bias offsets to optimize speed and other desired attributes of the modulator. The separate DC bias control is used to balance the power in the two modulator arms and some designs employ a second phase control to allow power and phase to be adjusted separately. After the electrical data modulation connections, the two modulator arms are combined using a power combiner, often a 2×2, to produce the modulated MZM signal which is directed to the chip output using an angled waveguide (not shown). The secondary modulator output is often used to monitor the modulated laser output power and reduces reflections back into the laser. One primary disadvantage of this design is the integrated device length is long due to the length of the input power splitter, s-bends associated with the input power splitting, the modulator arms and the power combiner. The ability of the modulator to produce a high extinction ratio (light on to light off) is limited by the manufacturing variation in the power splitter outputs and variation as a function of laser output wavelength. The increased length and impact of unequal power splitting ratio at the MZM input leads to integrated transmitters that consume large wafer areas leading to a decrease in the number of devices on a wafer, a high aspect ratio transmitter that leads to increased breakage and decreased yield, and decreased modulator performance. There are also fiber optic links that require the modulator to operate with negative frequency chirp, which is achieved in semiconductor modulators by designing the modulator to be asymmetric where one arm is longer than the other arm in order to introduce a half wavelength phase shift between the arms. This asymmetry is achieved by making one arm longer than the other or changing the waveguide width in one arm relative to the other arm. In both cases this asymmetry introduces uneven power balance in the modulator leading to decreased extinction ratio and degradation of other performance parameters. As is the case with the tunable laser in FIG. 1, the monolithically integrated laser and modulator described in these prior art devices makes characterizing important parameters of the laser, like the front and rear mirror reflectivity spectra, difficult to do in a manufacturable manner since only one output is available and the laser is designed emit its maximum power from the front mirror.

Figure 3:
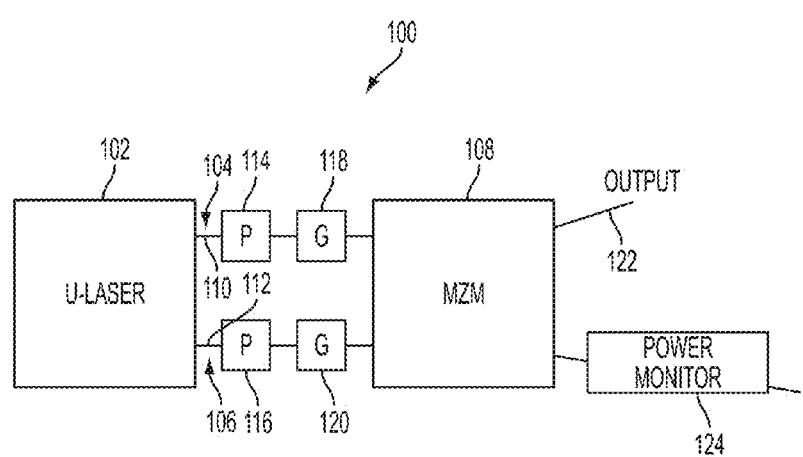
FIG. 3 is a schematic illustration of a tunable U-laser and modulator according to one embodiment of the present invention.

Referring now to FIG. 3, an optical device 100 comprising a monolithically integrated laser 102, also referred to herein as a widely tunable U-laser, having a first optical emission 104 and a second optical emission 106 where both the first and second optical emissions 104, 106 of the monolithically integrated laser 102 are in optical communication with a modulator 108 or other device is provided. The laser output emitted optical radiation is widely tunable over a wide wavelength range from between about 20 nm to about 100 nm. The wide wavelength range is represented by $\Delta\lambda/\lambda$ and is configured to be greater than a ratio $\Delta n/n$, wherein $\lambda$, represents the wavelength of the optical radiation (in the embodiments described here $\lambda$ is 1550 nm but the present invention is not limited to this wavelength band), $\Delta\lambda$ represents the change in the wavelength of the laser output optical radiation, n represents the refractive index of the mirror and phase tuning sections, and $\Delta n$ represents the change in the modulated refractive index of the gratings in the mirror tuning section in the present embodiment. In other embodiments described below, n and $\Delta n$ can represent changes in index of other structures like resonant rings, etc. Such widely tunable transmitters are used in today's telecommunications and data communications applications. The integration of the laser and modulator onto a single photonic integrated circuit (PIC) is important towards building low cost, low power consumption, high-density optical interfaces for a wide variety of optical fiber applications.

As shown in FIG. 3, the integrated laser 102 with two output optical emissions 104, 106, communicates via a first and second waveguide connected to waveguide each output emission port 110, 112 with first and second phase tuning sections 114, 116, and first and second optical gain sections 120, which provides control of output light from both laser facets 104, 106 (herein referred to as optical omissions or optical output) for input to an optical data modulator, and an optical data modulator 108 that is adapted to connect to both of the laser facets 104, 106. The modulator 108 is in communication with an optical output and a power monitor 124. As used herein, the term U-laser refers to the monolithically integrated laser 102 having two optical emissions or outputs (i.e., an integrated dual emission laser 102) however, as will be understood by those of skill in the art, and further described herein a "U-laser" has various embodiments including a tunable ring laser, Y-laser, and two amplitude and phase locked tunable lasers, which are configured to have the first and second optical emissions according to the invention.

The monolithically integrated dual emission laser 102 (e.g., U-laser) according to the present invention overcomes disadvantages of the prior art. The Laser 102 can be coupled to two-port devices like an interferometric optical data modulator while also allowing other independent optical elements to be placed after each laser output. The Laser 102 has two optical outputs that are balanced so that relatively equal power is transmitted out of each mirror, overcoming disadvantages of the prior art. The two optical emissions 104, 106 are connected directly to the two arms of the MZM optical data modulator 108, reducing the length of the modulator and removing the input power splitter, overcoming the disadvantages of the prior state of the art tunable MZM transmitters. Examples of optical elements that can be placed between the U-Laser and MZM are included but are not limited to a phase tuning section (P) 114, 116, and optical amplifier gain section (G) 118, 120.

The present invention enables power to be extracted from both laser facets and used in modulation, so the power out from each facet is designed to be approximately equal in order to produce a high quality modulated signal with other performance, cost and size advantages. One advantage over the prior art is that the approximately equal mirror reflectivities in the present invention results in laser reflection peaks that are balanced in width between the two mirrors with higher finesse leading to an improved SMSR.

Figure 4:
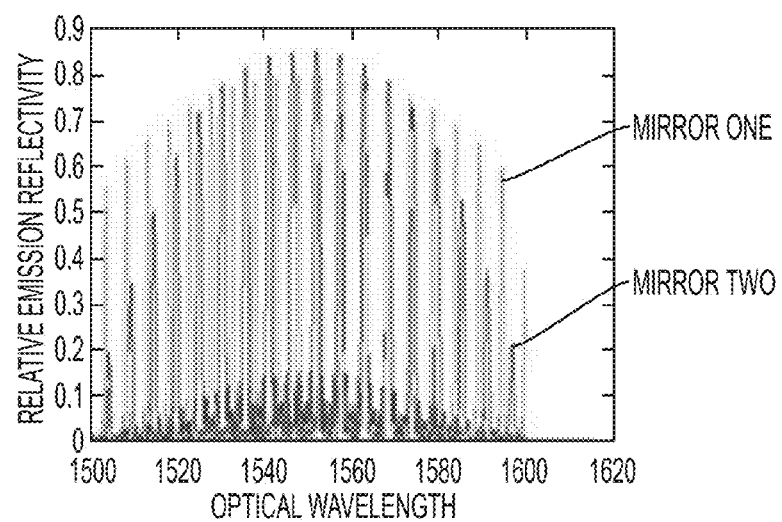
FIG. 4 is a graphic representation of the periodic mirror reflection design for balanced optical emissions from both laser facets of the U-laser according to the invention.

Referring now to FIG. 4, an example of a relative emission reflectivity spectra for the balanced mirrors used in the integrated dual emission laser 102 is shown in FIG. 4. As shown in FIG. 4, the dual laser has balanced power. The balanced mirror output of the present invention is an advantage over prior art designs where the mirrors are not balanced and one mirror is highly reflecting and the primary output lower reflecting to maximize laser output power into the modulator. This imbalanced design for a tunable lasers results in the reflectivity peaks of the primary output mirror being broader than that of the other mirror, leading to a reduced SMSR and other optical degradations as well as the inability to measure and characterize fully the optical properties of the laser in an manufacturable environment.

The present invention enables power to be extracted from both laser facets, so the power out from each facet is designed to be approximately equal. The advantage over the prior art is that the approximately equal mirror reflectivity's results in peaks that are balanced in width between the two mirrors with higher finesse leading to an improved SMSR due to narrower peaks for both mirrors. This is an advantage over designs where one mirror is high reflecting and the other lower reflecting to maximize output power such that the reflectivity peaks of the primary output mirror are broader than the other mirror, leading to a reduced SMSR. Other advantages that are known to those skilled in the art, include mirror designs that are balanced in bandwidth so that the peak roll-off for both mirrors occurs more slowly, enhancing the tuning range of the laser.

Figure 5:
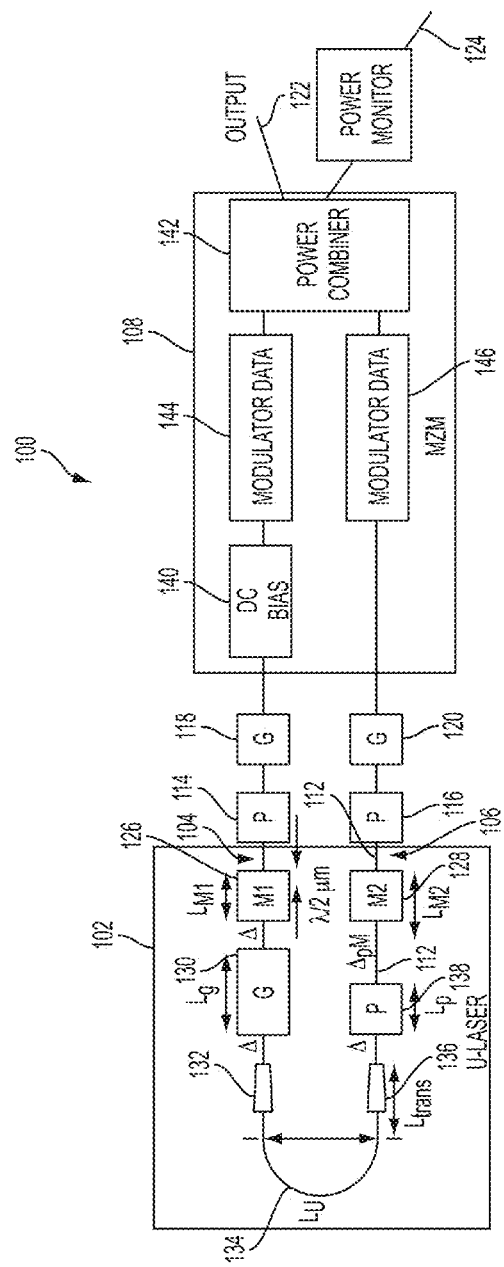
FIG. 5 is a schematic illustration of the tunable U-laser and modulator shown in FIG. 3, showing a curved waveguide U-bend in the U-laser, according to another embodiment of the present invention.

Referring now to FIG. 5, one embodiment of the integrated dual emission laser 102, shown in FIG. 3 is shown. The waveguides 110, 112 are connected to first and second mirrors M1 (126), M2 (128), which, on the top arm of the laser 102, is connected to a laser gain section G (130), and then, after connection through a transition region 132, the waveguide 110 is formed into a light bending portion 134, such as a U-shape, as shown in FIG. 5 or other shape such that both laser emissions 104, 106 communicate with multiple devices, multi-port connected devices or to the same optical chip output face. The light bending section 134 is preferably constructed to provide minimum loss for the optical signal 104, 106 across the frequency tuning range such that the optical laser gain can exceed the losses allowing lasing, preferably at the lowest threshold current as possible, with the highest slope efficiency as possible, and highest output power possible across the wide tuning range.

For the U-laser of FIG. 5, a transition regions between low loss ridge waveguides for the straight sections, and deep etched waveguides for the U-turn are employed 136 is in connection with the light bending portion 134, via the waveguide 112, the first transition section connected to the upper gain section and the second transition section connected to a phase tuning section 138 in the lower portion of the laser in FIG. 5. In the case of a tunable transmitter, the two laser facets present the laser outputs via the same direction to the two input ports of the Mach-Zehnder modulator (MZM) 108, as shown in FIGS. 3 and 5. Note that a significant advantage of the present invention over traditional lasers integrated with MZMs is that the input MZM power splitter is not required since both facets of the tunable laser are connected to each of the arms of the Mach-Zehnder Modulator. The modulator may have further components including DC bias 140, a power combiner 142, and one or more data modulators 144, 146. The MZM may be designed for simple intensity modulation formats or more complex coherent modulation that utilize nested MZM designs, as further described herein. Note that the traditional MZM input power splitter is not required since both facets of the tunable laser are connected to each of the arms of the Mach-Zehnder Modulator 108. Other elements can also be placed at each mirror output prior to the MZM inputs, including but not limited to power monitoring electrodes, phase modulator electrodes, optical amplifiers and optical isolator.

The U-laser in FIG. 5 consists of an upper arm and lower arm, with a laser gain section and Mirror 1 in the upper arm. Mirror 1 provides one port of optical emission to the modulator and is tunable. The gain section is connect to Mirror 1 on one side via an optical waveguide, and on the other side is connect via an optical waveguide to a 180 degree curved optical waveguide. The choice of waveguides depends on the integration platform. FIG. 5 illustrates the gain section waveguide transitioning to a different waveguide that is optimize for low loss 180 degree turning of the light direction. The lower arm of the U-laser contains a tunable phase section that is connected to the 180-degree turn on one side and to tunable Mirror 2 on via an optical waveguide. The loss of the straight and curved waveguides that connect the gain block to the tunable phase section as well as the other waveguides connecting the mirrors, and the loss of the mirrors themselves, must be kept as low as possible so that the available gain may exceed the losses to produce lasing and provide high enough optical emission power from each laser output as required for the application. The two emission outputs from tunable Mirrors 1 and 2 are connected in FIG. 5 via optical waveguides to a phase tuning section and gain section in order to provide controls to balance the inputs to the modulator as the wavelength is tuned, as aging occurs, with changes in environment conditions and other factors. For certain application the complexity of the transmitter can be reduced by not using intermediate phase or gain blocks. The modulator, and MZM interferometric modulator shown in FIG. 5, does not have an input optical splitter as is used in prior state of the art, which is a significant advantage in modulator length and power balancing as well as quality of laser SMSR and other parameters modulated by the modulator. The modulator is constructed with standard components and controls to allow data (digital RF) modulation and biasing of each modulator arm as well as DC biasing of one arm relative to the other. While one DC bias electrode is shown, the design is not limited to this configuration only. The phase and gain blocks connecting the U-laser and MZM can be used to balance the input as a function of wavelength and operating conditions and to optimize the modulated signal extinction ratio, chirp and signal to noise ratio for various settings of the bias and modulation drive signals or the upper and lower modulator arms. The output of the modulator, an MZM in this example, results from a power combiner that provides the interferometer function as well as providing an output port for connection other optical elements on the chip or bulk optical located off chip, for example collimating lens, optical isolator wavelength locking optics and circuits, and fiber focusing elements. A power monitor can be place on the unused output arm to provide feedback signal for control of the laser like power balancing and constant gain as well as reducing the reflections back into the laser due to the absorption from the detector.

Figure 6:
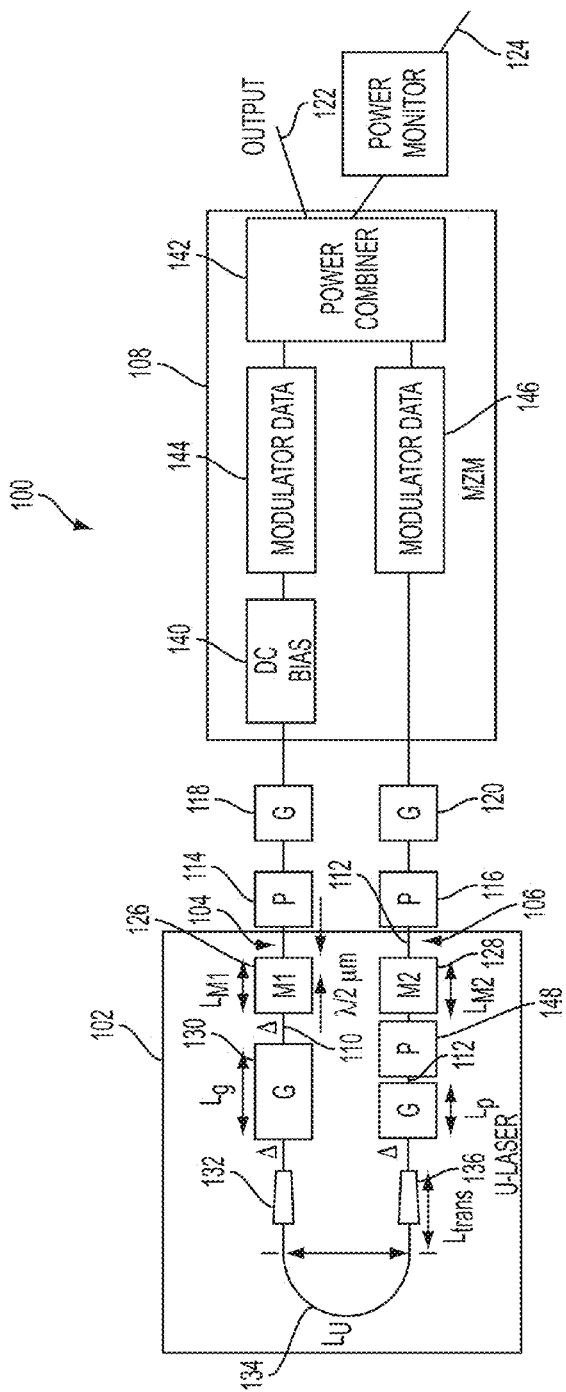
FIG. 6 is a schematic illustration of the tunable U-laser and modulator shown in FIGS. 3 and 5, showing an laser gain sections in both the upper and lower sections of the U-laser, according to another embodiment of the present invention.

Referring now to FIG. 6, the integrated dual emission laser 102 shown in FIG. 5 is shown also having an additional laser gain section 148 on the bottom arm of the laser 102. This aspect of the present invention is utilized in order to reduce the total length of the laser 102, reduce the transmitter area, and ensure that the important condition for single mode operation where only one Fabry-Perot peak occurs per aligned tunable mirror resonance. The longer the laser cavity, the closer the Fabry-Perot resonances and if the laser is too long two or more lasing resonance will fit under one alignment mirror peak. Therefore the laser length is confined to a maximum length such that the Fabry-Perot peak spacing, c/2nL, where n is the waveguide mode group index and L the laser length (based on the reflection locations inside the tunable mirrors) is greater than the spacing between the tunable mirror reflectivity peaks. The embodiment in FIG. 6 where the gain has been split into two sections on in the upper arm and one in the lower arm, allows the laser to be laid out as a shorter cavity than compared to that in FIG. 5. Therefore the embodiment in FIG. 6 is preferred and this design is on aspect of the present invention, the splitting of the gain section into two parts, one in each branch of the U-laser. It will be discussed below that there are other benefits from splitting the gain into the two branches that overcome other limitations of the prior art that the present invention encompasses. Each arm of the U-laser can have its gain tuned independently using separate current or thermal tuning circuits or together using one current or thermal control circuit. The tradeoff is in complexity of the control circuits with flexibility in operation, tuning and testing of the laser. The use of current or temperature is one method to tune the laser when it is based on an InP integration platform. Other platforms that can be used to construct the present invention may use voltage, current or thermal or a combination for tuning. Another key advantage of splitting the gain section into the upper and lower arms, as described later, is that the mirror characteristics and even the tunable wavelength control signal programming map can be obtained by blanking out one arm while the other is measured. This is a significant advantage over the present state of the art in that the full characteristics of the tunable laser can be measured by observing the signal only at the modulator output port and controlling combinations of the various gain and amplifier sections in the upper and lower arms as well as the mirror tuning current, temperature and other parameters. In order to have low threshold currents, high laser slope efficiency and high optical output powers it is desirable to fabricate the U-bend section with well under 3 dB of loss and as close to theoretical and practical values were the total loss is given by the straight waveguides, transition regions and U-Turn waveguide.

The integrated dual emission laser 102 has a light turning or bending elements 134 which, which are integrated onto the photonic chip to form the dual output emission laser. This allows for communications between the various elements of the laser, including but not limited to gain sections, phase tuning sections, tunable mirror sections. The light turning or bending elements 134 enable the U-laser to communicate to devices connected on the same side of the laser, connected to both laser mirrors.

A variety of optical integrated elements can be used for the light bending section 134. The waveguide can be formed into a U-shape, as shown in FIGS. 5 and 6, or other configurations are possible, including, but not limited to, total internal reflection (TIR) mirrors, curved waveguides, and free-space etched gap mirrors. These reflection techniques are commonly known by persons having ordinary skill in the art. Techniques for designing and fabricating TIR mirrors and deep etch and partially etched bends in indium phosphide PICs can be found in Summers, et al., "Concave Low-Loss Total Internal Reflection Mirrors in Indium Phosphide for High Fabrication Tolerance," Conference Paper, Conference on Lasers and Electro-Optics, Baltimore, Md., May 6, 2007, Integrated Optics (CTuH); and Nicholes, et. al., "An 8×8 InP Monolithic Tunable Optical Router (MOTOR) Packet Forwarding Chip," Journal of Lightwave Technology, Vol. 28, Issue 4, pp. 641-650 (2010).

Figure 7:
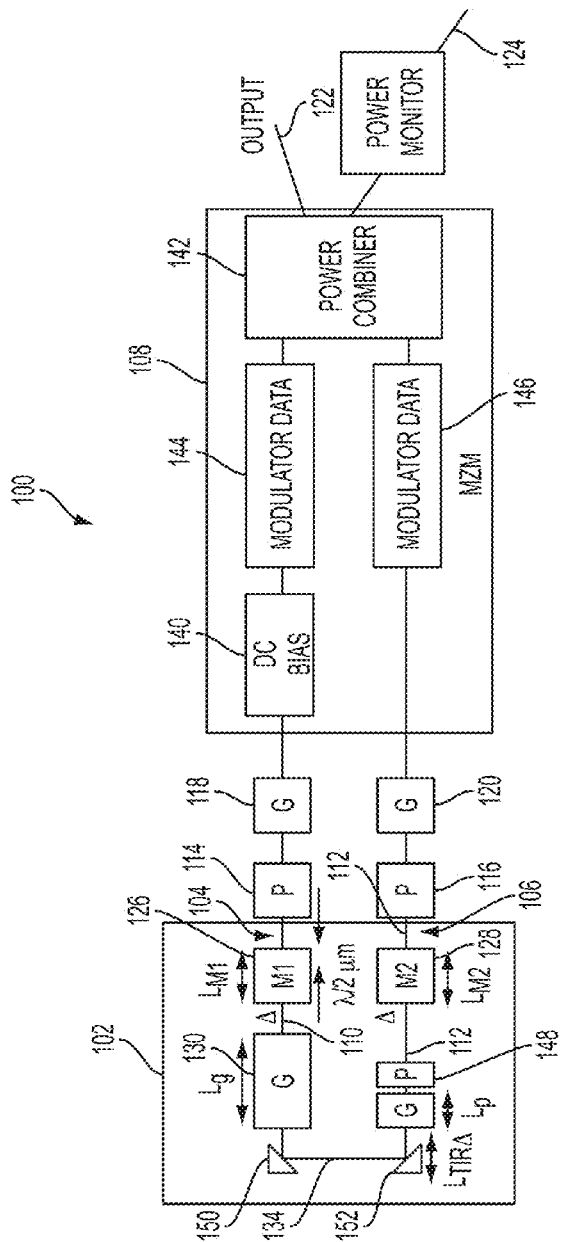
FIG. 7 is a schematic illustration of the tunable U-laser and modulator shown in FIG. 3, showing TIR mirrors U-bend in the U-laser, according to another embodiment of the present invention.

Referring now to FIG. 7, the integrated dual emission laser 102 shown in FIG. 6 is shown, having a pair of total internal reflection (TIR) mirrors 150, 152, for the light bending section 134. With this invention, the output power from both laser mirrors can be directed to a usable output connection from the laser or directed to further devices integrated on the same chip as described above. Using a U-shaped-like device, where power from both mirrors is utilized, the two laser mirrors can be designed with a roughly equal reflectivity that is chosen to maximize the output power while keeping the laser threshold current low and maintaining wide tuning range with high side mode suppression ratio and power across the tuning range. This ability to design a symmetric mirror laser provides multiple critical performance and characterization and measurement advantages over previous designs that employ only one laser mirror for output and modulation. In order to have low threshold currents, high laser slope efficiency and high optical output powers it is desirable to fabricate TIR mirrors with well under 1 dB of loss and as close to theoretical and practical values of under 0.25 dB per mirror, where the total loss is given by the horizontal and vertical waveguides as well as the mirrors that construct the U-turn section.

Figure 8A:
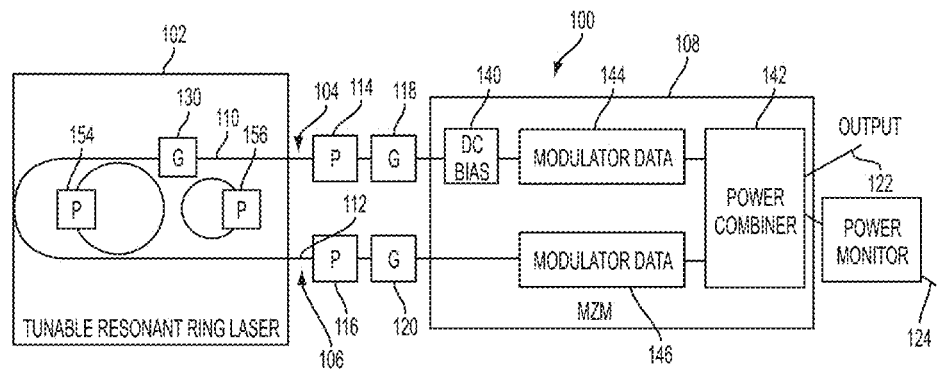
FIG. 8A is a schematic illustration of the tunable U-laser and modulator shown in FIG. 3, showing a tunable resonant ring laser as the U-laser, according to another embodiment of the present invention.
Figure 8B:
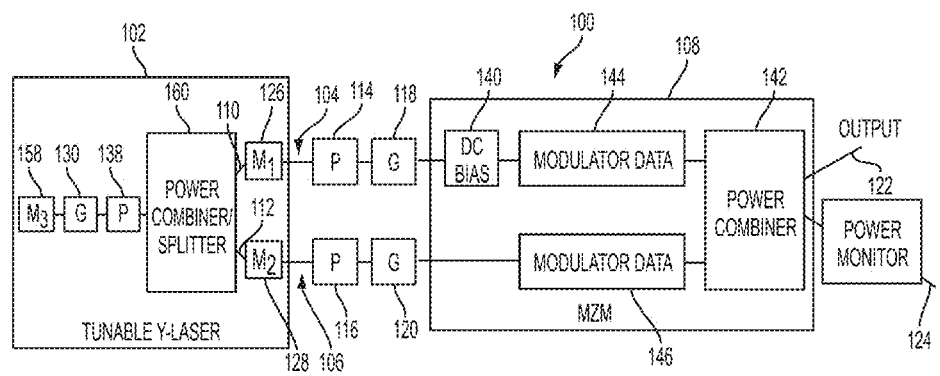
FIG. 8B is a schematic illustration of the tunable U-laser and modulator shown in FIG. 3, showing a Y-laser as the U-laser, according to another embodiment of the present invention.
Figure 8C:
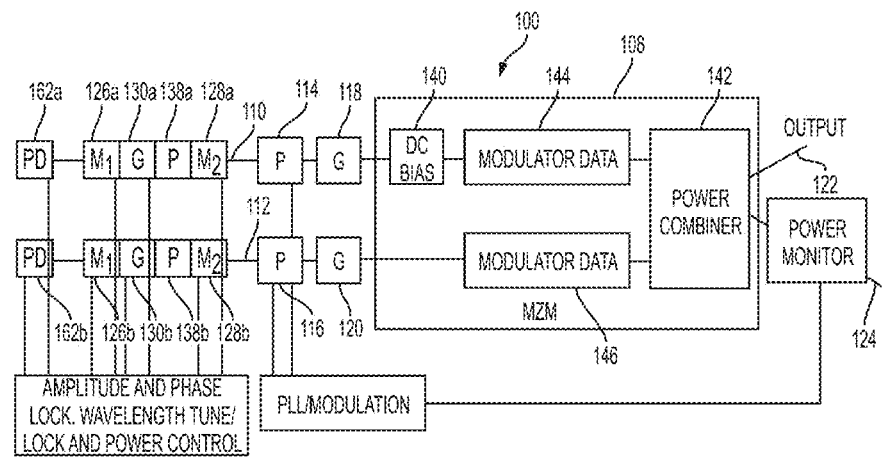
FIG. 8C is a schematic illustration of the tunable U-laser and modulator shown in FIG. 3, showing two separate amplitude and phase locked tunable lasers as the U-laser, according to another embodiment of the present invention.

Referring now to FIGS. 8A, 8B, and 8C, various embodiments of the integrated dual emission laser 102 are shown. As shown in FIG. 8A, the laser 102 is a tunable resonant ring laser with resonant rings of different diameters, each acting as a mirror, to produce the Vernier effect with a phase tuning element for wavelength tuning, that is tuned with voltage, current or temperature. One or more gain elements are located on the straight portion of the U-Bend waveguide that acts as a coupling bus to the resonant rings and whose two outputs form the two emission outputs that communicate to the interferometric, MZM or other dual port modulator inputs. The laser 102 shown in FIG. 8A has a waveguide 110 in connection with a laser gain section 130, which forms a U. Two phase tuning rings 154, 156 are in connection with the waveguide 110 to provide the dual output 104, 106.

Referring now to FIG. 8B, the laser 102 is a tunable Y-laser having first and second mirrors 126, 124, which are connected to waveguides 110, 112, and a power combiner/splitter 160, which is in connection with a laser gain section 130, a phase tuning section 138, and a third mirror 158. The mirrors in the Y-brand may be constructed using one of several known techniques including the sampled grating reflectors described above, ring coupled resonators as described above, or other Vernier type reflectors that can be tuned with an external control signal such as a voltage, current or temperature.

Referring now to FIG. 8C, the laser 102 is a two amplitude and phase locked tunable laser, each tunable laser having first and second mirrors 126a, 126b, 124a, 124b, which are connected to waveguides 110, 112, which are in connection with phase tuning sections 138a, 138b, laser gain sections 130a, 130b, and phase locker 162a, 162b. The tuning sections can be tuned using an applied voltage, current or temperature depending on the material system and design.

The present invention, as described herein with reference to FIGS. 3-8, is directed to a means to connect usable output waveguides from other photonic circuit elements and function, to both laser mirrors of a laser (or multiple facets from more than one laser) so that multiple benefits may be realized over connecting only one primary laser output. These benefits include but are not limited to:

Extracting maximum optical power from the laser;

Reducing tradeoffs that normally result in asymmetric laser mirror design;

Reducing the number of elements and element tradeoffs, required to connect the laser to multi-port devices, for example the input power splitters for interferometric optical data modulators as well as other examples.

Enabling the benefits of a pi phase shift (or other amount) pre-biasing of the optical phase into two paths of the subsequently connected element separately from the two mirrors, like optical data modulators, without the normal tradeoffs of engineering an asymmetric device like an asymmetric MZM including increased losses; and Enabling post laser power balancing or power monitoring or other elements to be placed before a connected element, like an optical data modulator, without requiring additional power splitters.

Enabling measurements of all laser components using the single modulator output including the reflectivity spectra of each mirror independently as a function of mirror tuning, tuning of adjacent components to the mirrors, chip temperature and mirror heating, crosstalk, mirror aging and reliability, SOA booster gain spectra, gain spectra for each arm of the laser. The present invention also enables using measurements of mirror reflectivities using the modulator output to calibrate and program the tunable laser, as well as conduct burn in and aging and reliability testing of the laser tuning properties as well as calibration of the modulator as the laser is tuned. This ability to measure the reflectivity of each mirror without interference from the other mirror or gain section using the single MZM output is a significant improvement over the prior art and leads to dramatic reduction in assembly, testing, characterization time and cost or manufacturing.

Additional advantages for the present invention include integration of a semiconductor laser, including tunable semiconductor lasers, with an optical data modulator and other integrated optical elements. This integration leads to lower cost, lower power dissipation and power consumption, smaller laser and transmitter size and area, more transmitter devices from a wafer, higher yield and higher performance in a tunable optical transmitter. The invention can also be readily integrated with a Mach-Zehnder Modulator (MZM).

The usefulness and functionality of MZM's in combination with tunable lasers is well known in the art. The U-laser laser takes up less space along the length of the chip, so there can be more devices per wafer and each transmitter is lower aspect ratio than prior art. The device is more "square," meaning it has a lower aspect ratio. Devices with a high aspect ratio can be damaged more easily in handling, especially InP devices, so having a lower aspect ratio or more being squarer is a benefit. Devices that are squarer are also easier to layout during mask and fabrication and fit more per usable area on the wafer. Electronic devices/chips are mostly square. The present invention allows for transmitter chip footprint that is squarer than the prior art, which is high aspect ratio (long and thin). For indium phosphide and other brittle materials that are used, having more square means less chance of breakage and higher yield during handling than the prior art high aspect ratio (long and thin) devices. Having a squarer device like the present invention also allows more devices to be laid out on a mask and chip than the higher aspect ratio prior art and the more square form factor is more compatible with the semiconductor electronics industry where almost all chips are square. So higher yield, less breakage, more devices on wafer and compatibility with electronics processing are advantages of the present invention. These are other advantages of the U-Laser and the U-Laser integrated with an MZM modulator The semiconductors that form the basis of the present invention, can be comprised of, but not limited to, indium phosphide (InP), silicon, and/or glass. The present invention describes an over laser design for integrated photonic circuits, and today one of the predominant materials system to realize such a device uses indium phosphide semiconductor based waveguides for the laser and the Mach-Zehnder Modulator. Fabricating the Mach-Zehnder Modulator in indium phosphide is desirable due to the short length and compact size and full compatibility with the tunable laser and an optical amplifier. Other approaches like silicon photonics can also be used to realize the present invention allowing higher volume commercial fabrication foundries to be employed, however today silicon photonics requires indium phosphide to be employed in various regions of tunable lasers and amplifiers to enable required optical gain. An important consideration when designing waveguide optical data modulators, is the electronic tuning of these waveguides in order to modulate the light, which is most efficiently achieved by designing the bandgap of the modulator semiconductor waveguides close to the tunable laser operating wavelengths and doping the modulator semiconductor waveguide in order to utilize both electrical carrier based and electric field modulation effects for biasing and driving the modulator. While this approach leads to efficient compact optical modulators, there is a tradeoff with absorption loss of the optical signal that depends on the waveguide electrical bias and also a wavelength dependence of the electrical drive signal. Overall loss can be reduced by integrating the laser with the optical modulator and an optical amplifier to boost the signal. Other important aspects of integrating a tunable laser with an optical Mach-Zehnder Modulator includes the wavelength dependence of the electrical modulation drive signal that can be handled by using a lookup table or similar approach to store MZM electrical drive values as a function of laser output wavelength. Wavelength adjustment of the electronic signals also can be tuned to adjust bias, modulated extinction ratio, chirp and other parameters of the optical signal.

A first aspect of the present invention is the use of two or more output laser facets of one laser or multiple locked tunable lasers instead of just one laser output facet making more efficient use of the generated light.

The second aspect of this invention is a U-laser that is designed so that both laser facets are used by subsequent devices on the same integrated circuit, where the light from both laser facets is directed in the same direction and coupled directly to a subsequent two-port device like a Mach-Zehnder Modulator.

A third aspect of the present invention is the ability to have independent power monitoring, attenuation, gain or other adjustment elements placed after each laser mirror.

A fourth aspect of the present invention is to allow each of the output mirrors to be designed to maximize the transmission power while maximizing the SMSR and other factors normally traded off with change in mirror reflectivity, including but not limited to SMSR, chirp control, free spectral range, tuning range and laser line width.

A fifth aspect of the present invention is direct connection of both laser facets to the modulation arms optical data modulator eliminating the need for a first power splitter and increasing the power input to the optical data modulator through the reduction of waveguide length and s-bend or turning losses normally required after the splitter and removing the fabrication tolerance that exists when making and using power splitters as interferometric modulator input splitters. The actual mirrors of the U-laser can be grating based mirrors or can be reflections based on other resonator elements such as, but not limited to, cascaded ring resonators, as shown in FIG. 3.

A sixth aspect of the present invention is the ability to bias one of the Mach-Zehnder arms relative to the other arm, for example with a half wavelength phase shift, by setting back one mirror relative to the other mirror along the output waveguides enabling functions like zero bias Mach-Zehnder Modulators that allow negative chirp driving with lower loss without the disadvantage associated with fabricating MZM arms of different lengths.

A seventh aspect of the present invention is to allow the reflection characteristics of both mirrors to be measurable at the modulator output using the same measurement system or coupled fiber. The present invention provides access to each mirror such that they can be measured independently, at the same modulator output, by turning on the booster amplifier associated with the mirror to be measured while turning off the gain section in the other arm (making it absorbing) such that the booster amplifier emission spectrum is reflected off the mirror to be measured, without interference from the other mirror. Since the booster amplifier is fabricated monolithically on the same chip as the laser gain sections, this measurement has the advantage that the gain peak and shape can be measured and characterized relative to the mirror reflection peaks and changes in both can be measured as functions of temperature, mirror tuning, amplifier gain, aging, etc. and each mirror measured by switching to the other arm and performing the steps described above.

An eighth aspect of the present invention is to utilize multiple gain sections in the laser cavity, as shown in FIGS. 6-7. Forming multiple gain sections is advantageous because it enables the U-shaped laser cavity to be designed as short as possible, where the shorter cavity increases the Fabry-Perot mode spacing and hence reduce the number of Fabry-Perot modes that coincide with the tuned filter wavelength, improving the tuning resolution, accuracy and stability.

A ninth aspect of the present invention is to enable the electrically controlled elements of the laser, the modulator, and the other control an monitoring elements, to be fully controlled by an external programmable electronic control system, for example an FPGA and analog/digital and RF interfaces, to fully characterize, program, map, tune, and operate the laser and modulator and complete transmitter via information from the output fiber and the electrical connections in the manufacturing, test, qualification, burn in, reliability and customer environments. The ability to probe all aspects of the device in this manner is a significant improvement over the prior state of the art.

Figure 9:
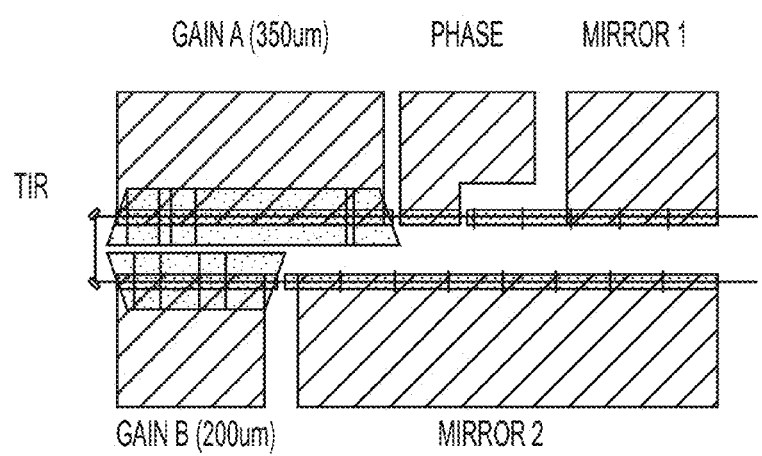
FIG. 9 is a schematic illustration of a mask layout used to make the tunable U-laser according to another embodiment of the present invention.

Another embodiment of the invention is shown in FIG. 9. Referring now to FIG. 9, a U-laser mask layout of the embodiment illustrated in FIG. 7 is shown in order to illustrate some common design points and considerations. The horizontal optical waveguides to the right or the mirrors provide the tunable two emission outputs. The horizontal optical waveguides to the left of the gain sections turn 180 degrees using a pair of TIR mirrors and a vertical waveguide. The horizontal optical waveguide run the length of the upper and lower halves of the U-Laser. The two gain sections, of 200 micrometers and 350 micrometers in length provide a total gain when biased to overcome all the losses in the laser including waveguide loss, TIR mirror and tunable mirror loss and other loss mechanisms. The trapezoidal shapes over the waveguides in the gain sections are the active gain regions in the III-V InP semiconductor, where for this embodiment offset quantum wells are used to provide gain. The waveguide regions under the mirror sections are passive waveguides without quantum wells, that have had grating bursts etched partially into the waveguides, seen as vertical lines across the waveguide, to form mirror 1 and mirror 2. The remainder of the waveguides, under the phase section and in the regions not covered are passive. The large square structures to the top and bottom of all sections are metal contact pads to connect current to each section to provide gain current injection or mirror or phase tuning to tune the wavelength.

While the embodiment described here is a III-V InP based integration of the U-laser and MZM, other material and integration systems can be used to realize the present invention. The present mask in FIG. 9 illustrates the basic components of fabricating a U-Laser using TIR turning mirrors and two output facets with mirrors that tune the wavelength, in coordination with tuning the phase section, based on the Venire effect. For the InP III-V material system processed with this mask and fabrication experimental results shown in Figures below, a base epitaxial wafer was grown with an n-doped semiconducting InP substrate, followed by a 1.4Q InGaAsP waveguide layer, followed by a 7 layer offset quantum well structure designed to provide optical gain in the C-band, followed on top by a P-doped InP cladding layer, then a P-doped InGaAs metal contact layer. The mirror gratings were defined in the passive ridge waveguides in the mirror locations using ebeam lithography. The ridge waveguides and deep etch U-bend and TIR mirrors were dry etched with a wet etch clean up on the ridge waveguides with the deep etches protected. The waveguides and field regions were covered with silicon nitride, and where metal contacts needed to be made on the gain, phase and mirror sections, vias were etched on top of the ridge waveguide and a cap InP layer removed to expose the InGaAs contact layer for metal pad deposition. The final wafer was thinned to approximately 100 microns and a backside metal layer was deposited, allowing each section to be operated as a forward bias PN junction. Monitor photodiodes are fabricated with metal contacts and are run in reverse bias. The MZM modulator is fabricated by adding a layer of BCB under the metal contacts to decrease the capacitance, and very narrow, about 2.5 micron wide, ridges are used as the modulator arms with metal electrodes deposited for RF modulation. The modulator mask is not shown in this figure nor is the portion of the mask with the external phase and gain sections between the laser and the modulator.

Figure 10A:
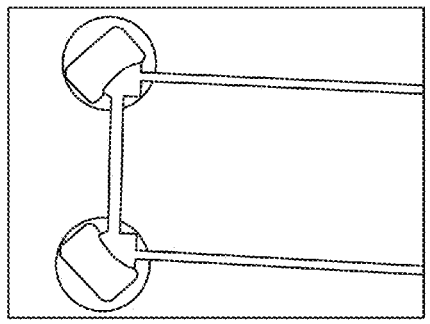
FIG. 10A is a magnified image of a set of TIR mirrors used as the U-turn in the U-laser, shown in FIG. 7.
Figure 10B:
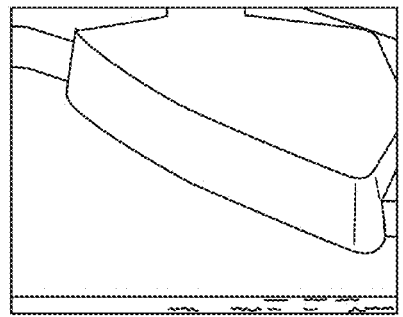
FIG. 10B is a scanning electron micrograph image of a fabricated low loss TIR mirror as illustrated in the embodiment shown in FIG. 7.
Figure 10C:
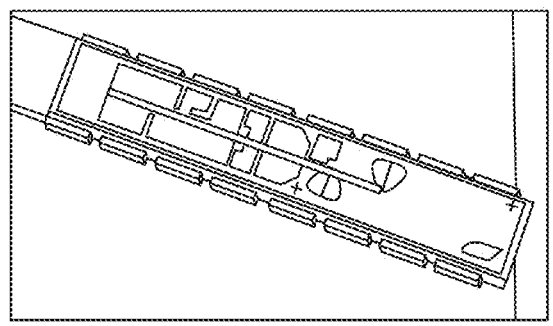
FIG. 10C is an image of a fabricated U-laser as illustrated in the embodiment shown in FIG. 7.

Referring now to FIGS. 10A, 10B, and 10C, images of a fabricated U-laser with TIR mirror based U-Turn are shown. FIG. 10A shows a magnified optical microscope image of the TIR mirror U-Turn to the left of the gain sections illustrated in FIG. 7. FIG. 10B is an image of a scanning electron micrograph of the reflecting face of the TIR mirror formed using a deep etch process. FIG. 10C shows a completed photonic integrated circuit (PIC) transmitter based on one embodiment of the present invention, with the a TIR mirror based U-Laser on the left hand side of the PIC.

Figure 11A:
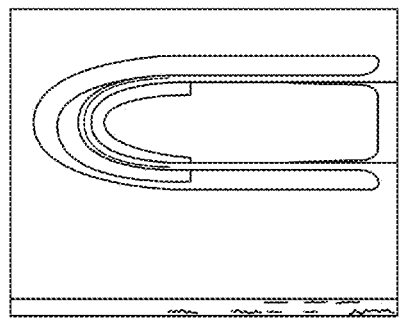
FIG. 11A is a magnified image of a fabricated low loss 180-degree bend deep etched waveguide U-turn transitioning to ridge waveguides, as illustrated in the embodiments shown FIG. 5 and FIG. 6.
Figure 11B:
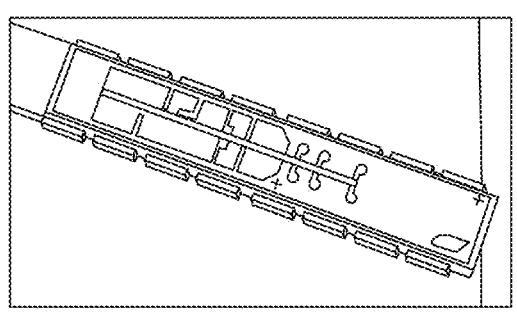
FIG. 11B is an image of a fabricated U-laser, showing the curved waveguide U-turn and transition regions of the waveguide.

Referring now to FIGS. 11A and 11B, images of lasers, as illustrated in the embodiments shown in FIGS. 5 and 6 are shown. FIG. 11A shows a fabricated U-turn used as the 180 degree light bending section 134. FIG. 11B is an image shown the transition region of the waveguide, and the fabricated light bending section 134. According to the embodiment shown in FIGS. 11A and 11B, the waveguide can be deep etched or otherwise etched to fabricate the laser with the requirement that the U-Turn should have low loss, under 3 dB and preferably under 2 dB so that the gain sections can run a low current and the laser exhibits a low threshold current (preferably under 30 or 20 mA) and high optical output power from both emission ports or facets, greater than 5-10 dBm total across all tuning wavelengths. As shown in FIG. 11A, the laser 110 is ridge etched to form the waveguide 110, 112, the U is made with a deep etched waveguide. However, as will be understood by those of skill in the art, the laser 102 can be fabricated all or in part with deep etching of the waveguide, or other fabrication methods. FIG. 11B shows a completed fabricated transmitter based on a deep etched curved waveguide U-Turn with the U-laser on the left side of the PIC.

The U-laser may be used with the modulator disclosed below, or with any other modulators known in the art.

Modulator

Modulators are well-known in the art as described in U.S. Pat. Nos. 6,628,690 and 7,633,988, herein incorporated by reference in their entirety.

The present invention provides a device, means and method to provide an integrated solution to transmit data over an optical fiber using a widely tunable semiconductor laser, where the emission wavelength is determined by programming the laser and an integrated data modulator whose function is modulation of the data onto the laser output wavelength using an interferometric Mach-Zehnder Modulator, which itself can be programmed using test and calibration data in coordination with control circuits and lookup logic like an FPGA to support tunable wavelength transmission as well as desired transmission modulation characteristics that change with wavelength and environmental and operating conditions and aging.

FIGS. 5-8 and 14-16 show versions of the modulator according to the present invention. The new modulator design is based in part on prior art MZM designs, with the first portion of prior designs eliminated, primarily the input splitter and the s-bend waveguides normally associated with an MZM or other interferometric structure. Referring now to FIGS. 5-8, the modulator comprises two inputs that are directly connected to both optical emission facets of a U-laser, using straight waveguides, or other laser structure with both facets made available in the same direction either by laser design or using a waveguide turning technique explained above (e.g. TIR mirror or waveguide bend). The two modulator arms serve as the direct inputs and can contain one or more of the following elements, optical amplifiers, optical isolators, optical power monitors, optical DC phase control sections, optical RF modulation sections (lumped or distributed or traveling wave). The waveguides for the two inputs to the MZM are fabricated with a material with a bandgap that ideally is greater than the light to be modulated. In the case of a semiconductor transmitter, this is achieved by using epitaxially grown material structure that contains a waveguiding layer that is designed with the correct bandgap, or a layer that is made to be transparent using techniques like quantum well intermixing (to shift the band edge). The input waveguides ideally should have a strong electro optic effect, in other words the index of refraction should vary strongly with an applied electric field or current, in order to keep the modulator arms and modulating electrodes as short as possible. This is a key design consideration for keeping the capacitance and resistance low for high speed modulation, for keeping the absorption as low as possible with a high strength phase modulation, and ensuring that the desired physical effects are employed for zero chirp or negative chirp transmission (preferred chirp parameters for most deployed fiber).

The modulators according to the present invention preferably eliminate the power splitting portion used in prior art modulators. The modulators according to the present invention have multiple advantages in that tradeoffs are reduced by the elimination of the power splitter. The power imbalance, fabrication tolerances and other factors that lead to performance degradation due to power splitter imperfections and operating conditions (like environments and temperature changes) is greatly reduced in the devices of the present invention, making the devices of the present invention more robust. Elimination of the first power splitter also allows for each arm in the interferometer to be adjusted by physically placing the laser mirrors at optimum positions with respect to the MZM elements. It should be noted that the length of the MZM modulator is much shorter than the prior art that uses an input splitter and the bending losses typically associated with using an input splitter are eliminated as well as the extra losses incurred by the post splitter bends and waveguide length used in prior art, all lead to a significantly reduced overall modulator loss and higher transmitter output power. The preferred prior art configuration, which uses an asymmetric MZM design results in increase loss due to s-bends or other elements used to make one modulator arm longer than the other. Other techniques to imbalance the modulator to yield certain preferred performance characteristics like negative chirp, and result in degradation of other characteristics. The present invention greatly reduces these tradeoffs.

For certain applications, particularly new high speed applications like 100 Gbps, 200 Gbps, 400 Gbps, 800 Gbps and faster, coherent communications is an important way to increase the capacity per transmitter and improve the spectral efficiency and reach of transceivers and transmitters. Coherent communication requires transmission of signals where the phase, amplitude or both are modulated at the transmitter. As the cost of these high speed coherent transmitters are relatively high, using a tunable laser is critical to keeping the overall deployment and operation and maintenance costs down by providing fewer parts and easier sparing and replacement as well as real time network configuration by wavelength control.

Figure 14A:
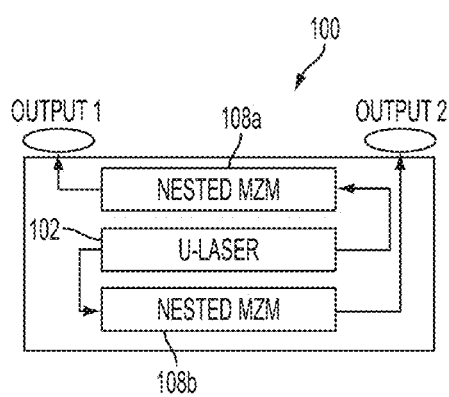
FIG. 14A and FIG. 14B are schematic illustrations of different embodiments of a coherent tunable transmitter based on a U-laser connected to nested optical data modulators according to another embodiment of the present invention.
Figure 14B:
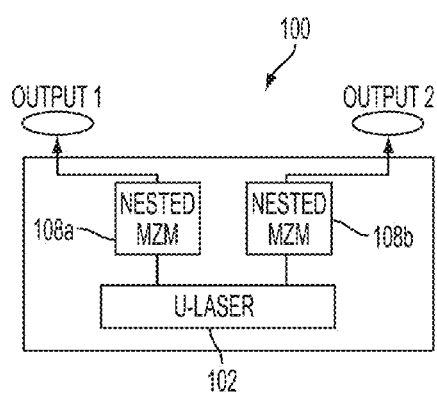

Referring now to FIG. 14A and FIG. 14B, an optical device comprising a monolithically widely tunable integrated laser, having a first optical emission port and a second optical emission port, that have been designed to emit approximately equal powers, wherein the first optical emission port is in communication with a first coherent modulator, and the second optical emission is in communication with a second coherent modulator. The first and second modulators communicate with the transmitter first and second outputs, output 1 and output 2, respectively. The modulators are connected via waveguide that employ turning elements like TIR mirrors in order to balance path lengths and losses between the laser output emission ports and each modulator. Additionally gain elements can be placed between the laser emission ports and the modulators to balance the power. In order to increase the capacity of the transmitter output, one approach is to combine to independently modulated polarizations, from the same tunable laser, into the fiber. This can be done on the integrated chip using polarization splitter, combiners and rotators and is compatible with the present invention. Or as shown in FIGS. 14A and 14B another embodiment is to use external bulk optical components to collimate two separately modulate data outputs in the same polarization, then use lenses to collimate the light and external polarization rotation on one port to create one output as TE and the second output as TM polarized light, followed by a polarization beam combiner and a lens to focus the combined light into the fiber. The embodiment shown in FIGS. 14A and 14B show nested Mach-Zehnder modulators that allow the optical signal to be modulated in both amplitude and phase as well as providing two MZM modulators inside each arm to allow modulation between two constellation phase/amplitude points per bit period. The use of 2×2 multi-mode interference couplers as power combiners and splitters has the added advantage of providing the necessary $\pi$ phase shift required in a coherent nested MZM modulator. In this manner, for example, each modulator can be run at 25 Gbps, resulting in 50 Gbps per nested modulator and using two polarization states yields 100 Gbps. As shown in FIGS. 14A and 14B, the output waveguides are separated enough to accommodate communication to external optical elements for one or two outputs, such as collimating lenses, optical isolators, polarization rotators, splitters and combiners, wavelength lockers, fiber focusing optics, etc. These bulk external components occupy space, typically between 1 mm and 2 mm in width, so the waveguides at the output need to be separated to accommodate these elements. The present invention enables this accommodation without subsuming large chip area on the wafer and allows a design with a tightly folded structure. Another advantage of the device shown in FIG. 14A is that it is long and narrow and maximizes the number of devices that can be positioned on a wafer. FIG. 14B shows an alternate embodiment where the two output emission ports of a U-laser are directly connected to the input ports of two nested MZM coherent data modulators, effectively yielding the same operation as that described for the embodiment in FIG. 14a.

Referring now to FIG. 15, an optical device is shown having further details of the coherent nested modulators and, which are connected to a dual output balanced laser and output 1 and output 2, respectively, shown at a higher level in FIG. 14A.

Referring now to FIG. 16, another embodiment of an optical device is shown having further details of the coherent nested modulators and which are connected to a U-laser and output 1 and output 2, respectively, shown at a higher level in FIG. 14B.

U-Laser in Combination with Modulator

Integration of a tunable laser onto a common substrate with a MZM optical data modulator and semiconductor optical amplifier is well known in the art. There have been multiple embodiments of wavelength tunable lasers with Mach-Zehnder Modulators and semiconductor optical amplifiers. In addition to monolithic integration of the tunable laser with the optical data modulator, there are characteristics of the transmitted optical data bits that need to be controlled, typically at the modulator, in order to transmit at rates of 10 gigabits per second and higher over transmission distances greater than several hundred meters using standard single mode optical fiber that is predominant type in the ground today. Key transmission characteristics that should be controllable include the modulated signal optical chirp, extinction ratio, optical signal to noise ratio as well as fiber coupled optical power. Control of these parameters is essential to cost effectively ensuring that optical data launched into the fiber at the transmitter arrive at the receiving end with as little shape distortion as possible, as much signal as possible and as little noise as possible for all of the tuning wavelengths. Additionally, the temperature dependence of these characteristics must be minimized and controlled to enable operation in real environments.

FIG. 10C is an image of a complete fabricated transmitter consisting of a TIR mirror based U-laser, a MZM with DC Bias and Modulator Data and Data_Bar electrodes, phase bias and gain sections connected to both laser emission outputs and both MZM inputs, and two output waveguides, one for connection to external optical components including the fiber and the other with a power monitor electrode as illustrated in FIG. 7. It should be noted that the length of the MZM modulator is much shorter than the prior art that uses an input splitter and the bending losses associated with the input splitter as well as the extra waveguide length significantly reduces the overall modulator loss.

To facilitate control of chirp and extinction ratio, the Mach-Zehnder indium phosphide modulator has various parameters designed including a phase offset in one modulator arm relative to the other modulator arm to enhance negative chirp characteristics with high extinction ratio. The optimization of interferometer biasing and other drive conditions is known. Integration of the widely tunable wavelength Sampled Grating Distributed Bragg Reflector laser has also been reported and with an external Mach-Zehnder Modulator.

Figure 12B:
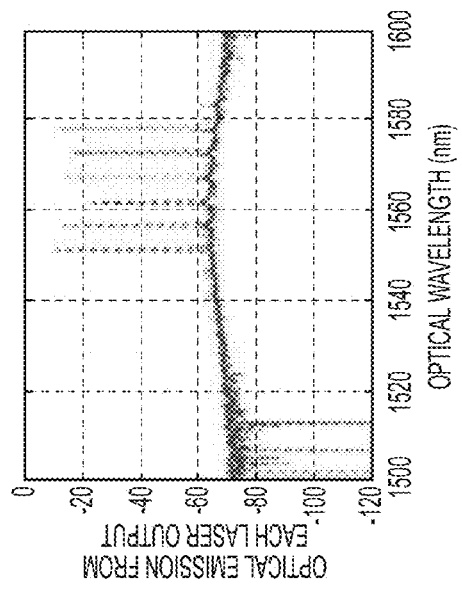
FIG. 12B is a plot of example wavelength tuning of the U-Laser mirrors showing laser output at various wavelengths for different mirror tuning currents.
Figure 12A:
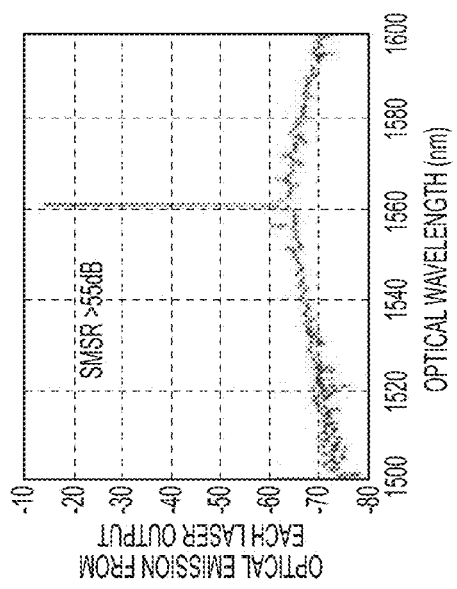
FIG. 12A is a plot of measured output optical emission spectra from the U-laser outputs showing power as a function of wavelength showing the main peak and the high resulting side mode suppression from a U-laser according to the invention.

Referring now to FIG. 12A, data from a completed transmitter with U-laser and showing the main peak from a laser output is shown. As shown in FIG. 12A, unwanted peaks from the laser are better than 55 dB down from the main peak. Referring to FIG. 12B, the tuning of laser outputs at various wavelengths is shown. This figure illustrates the improvement in output laser quality for a balanced tunable mirror design over the prior art that uses asymmetric mirror reflectivities.

Figure 13:
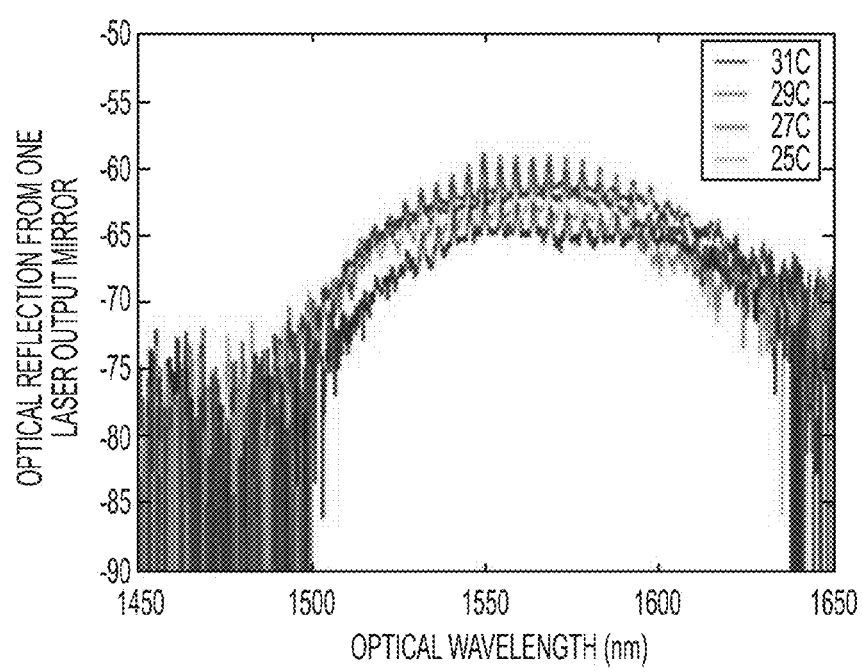
FIG. 13 is a plot showing the measured reflection spectra as a function of temperature of one of the mirrors of a U-laser measured using the output booster amplifier connected to that mirror, with the other mirror arm turned off and a spectrum analyzer connected to the modulator output.

Referring now to FIG. 13, the emission spectra of the laser output as a function of wavelength and temperature is shown. An advantage of the current invention is that either arm of the laser can be tuned by shutting down a gain block on either arm and the reflectance from the output port can be observed and/or monitored. Accordingly, the laser can be tuned and monitored in a way that is exceedingly difficult for a single output laser. This advantage of the present invention greatly improves the ability to fully characterize the optical qualities of the laser by monitoring the modulator output including the mirror reflectivity spectra for each mirror independently, the dependence on temperature and other components on the chip, the tuning characteristics, deviations from intended designs, and aging and reliability issues of the mirrors. This technique also allows the gain to be measured at the single MZM output. Control of the laser an modulator from a programmable electronic system with optical diagnostic tools interfaced to the modulator output provides a much more powerful and manufacturable way to program, characterize, test integrated tunable transmitters than prior art where this function is much more difficult to do in a production line or cannot be done due to the transmitter and laser design.

According to another embodiment of the invention is a U-Laser configuration with a dual input MZ modulator. Other U-laser versions can vary mirror reflectivity amplitude and/or phase statically or as a function of length, mirror period, number of bursts and other mirror parameters number of gain sections and gain section lengths, and TIR mirror design, aspects which have been published in the public literature. Passive sections and SOAs after tunable mirrors can be used to balance the power and shift the phase in both arms before the MZM and the appropriate optical isolator technology employed to minimize reflections back into the laser. The integration platform should minimize the reflections back into the laser that can be achieved by matching the effective index of the mode in each laser and subsequent waveguide sections.

The present invention overcomes this limitation by utilizing both laser outputs for data modulation, by connecting both mirrors to the modulator, and therefore the mirrors can be designed to be more equal with each mirror designed for a desired balanced output power as well as SMSR and laser line width. Therefore, another aspect of the present invention is the integration of the laser with an optical modulator.

The present invention describes a new laser and tunable laser design approach wherein a widely tunable semiconductor laser is constructed in a novel U-shape and the invention is then further implemented as another aspect of the invention, by monolithic integration on a common indium phosphide substrate with a Mach-Zehnder Modulator that is connected to and driven by more than one of the laser output facets. The advantages of designing a U-shaped widely tunable laser and utilizing both laser facets in the data modulation, by connecting each facet to one of the modulator inputs, allows the tunable laser mirrors to be designed to each reflect approximately 50% of the optical power, allowing the SMSR out of each facet to be maximized and coupling the output power from each facet into the modulator without requiring one of the mirrors to be low reflectivity for maximum laser output power. Further integration of the laser with modulator by directly connecting both laser output ports to what would normally be the mid-stage section of a Mach-Zehnder Modulator is non-obvious and has multiple advantages over prior art as described in more detail below. Since both facets of the laser are used for transmission through the optical modulator, both mirrors can be designed for maximum power transmission and allowing high side mode suppression ratio to be reached with high output power.

As discussed above, a drawback of many of prior designs is the use of two splitters or multi-mode interference (MMI) couplers to take the laser output from one facet, and via a waveguide inline with the laser, split into two arms of optical waveguides that contain the modulation elements and then combine the signal to the output using a second MMI. The fabrication of MMI and other splitter structures is very susceptible to fabrication tolerances and the output of a Y-branch splitter is difficult to control to exactly 50/50.

These imbalances can depend on the MMI or Y-branch width or length of coupling region, over etching of the sidewalls, and other process variations and changes in temperature. Additionally, the added length and loss associated with S-bands and increased waveguide lengths or other bending structure, makes the present invention a lower loss optical data modulator due to its direct connection via straight waveguides to the two output emission ports of the tunable U-laser.

The first part of this invention is a means, method and apparatus to modulate a tunable laser using a Mach-Zehnder Modulator where the two primary arms of the modulator are connected to two or more laser facets instead of the prior art that connects the Mach-Zehnder Modulator to one laser facet. The connection of the Mach-Zehnder Modulator to two or more tunable laser facets is described for a variety of tunable laser structures. The second part of this invention provides a means, method and apparatus for a tunable laser structure configured in a U configuration that provides the direct connection of two laser facets to the Mach-Zehnder Modulator, where the U-Laser can be realized as a stand-alone semiconductor laser component on one substrate or preferably the U-Laser is integrated onto the same substrate as the Mach-Zehnder Modulator, realizing the benefits of the fully integrated structure. Additionally, a means for integrating a semiconductor optical amplifier onto the same substrate as the tunable laser and Mach Zehnder Modulator is disclosed.

The bias and drive electrode configuration of the optical MZM is very important to lower power designs that use low voltage drive signals, particularly important for CMOS direct drive circuits and lower power dissipation electronics in general. The most common configuration uses 4 RF electrodes, two per MZM arm, that act as two sets of series push-pull electrodes. The 4 electrode push-pull configuration allows driving the modulator at a given bandwidth at half the drive voltage compared to using a non-push-pull or single arm drive configuration.

It should be noted that the implementation of the U-Laser and Mach-Zehnder Modulator are not limited to solely the indium phosphide material system. Other embodiments can include silicon photonics, silicon photonics combined with indium phosphide and combination of these semiconductor systems with glass based and silicon nitride based waveguide systems.

Each invention may be used with the other, and other modulators and/or lasers may be used as well with the corresponding inventions. For example the two normally unused outputs of a Y-branch tunable laser may be used with the present modulator design. The two output buses of a tunable ring resonator based laser may be connected to the present modulator design. Alternatively, the two outputs from the U-Laser may be connected directly to the two buses of a ring resonator based modulator, two independent electro absorption modulators (EAMs).

The present invention overcomes limitations of prior and related art for wavelength tunable transmitters with the tunable laser and Mach-Zehnder Interferometer Modulator and/or semiconductor optical amplifiers for the following reasons:

A first aspect of the present invention is use of two or multiple facets of one or more tunable lasers instead of just one laser output facet making more efficient use of the generated light;

A second aspect of the present invention is minimizing the use of multimode interference power splitters/couplers or other splitters/combiners designs, which are often sources of unknown processing errors in splitting ratio and reduce aspects of the transmitter performance like extinction ratio and optical signal to noise ratio;

A third aspect of the present invention is integration of the Mach-Zehnder Modulator without the traditional first splitter/combiner with a wide variety of tunable laser designs, particularly designs that inherently have two or more readily accessible output ports in the same directions;

A fourth aspect of the present invention is to provide a novel tunable laser design, the U-Laser, that is well matched with the requirements for the modulator portion of the present invention;

A fifth aspect of the present invention is the ability to adapt the Mach-Zehnder Modulator arms to connect to facets that are in counter directions by employing well known reflection techniques like total internal reflection or air gap mirrors, where these mirrors can also be employed to serve other beneficial functions like power monitoring taps; and A sixth aspect of the present invention is to allow adjustment of one of the two arm paths in the Mach-Zehnder Modulator by designing the wavelength distance difference from the two or more laser facet outputs, to result in the well-known advantage of introducing a differential phase shift between the arms to yield negative frequency chirp in modulators that employ the quantum confined stark effect for modulation. The initial separation of the two Mach-Zehnder arms from two or more laser facets enables controlled chirp and phase control required for coherent modulation techniques are readily employed in these structures.

A seventh aspect of the present invention is the greatly reduced length of the MZM modulator over prior art MZMs that uses an input splitter as well as the elimination of bending losses associated with using an input splitter. The present invention further reduces the modulator optical losses by eliminating almost a third of the waveguide length in a traditional MZM due to the material, waveguides and post splitter bends. There the present invention leads to a significantly reduced overall modulator loss, better extinction ratio and signal to noise ratio and higher transmitter output power.

The modulator may be used with the U-laser, as disclosed below, or with any other lasers known in the art that can present two optical emission outputs or facets to the present modulator invention inputs.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention

The invention claimed is:
1. A monolithically integrated laser comprising:
an integrated dual optical emission port laser having a first optical emission port and a second optical emission port; and
an internal light bending section configured to bend light from one of the first optical emission port and the second optical emission port into the other, the first optical emission port having a substantially balanced laser output with respect to the second optical emission port, wherein both the first and second optical emission ports of the integrated dual optical emission port laser are in optical communication with a modulator comprising two arm paths, wherein the first optical emission port and the second optical emission port are directly coupled to the two arm paths of the modulator, respectively, without requiring use of an input splitter, the two arm paths of the modulator each being configured to have a phase section and a gain section, wherein the integrated dual optical emission port laser has a balanced power output, and wherein a mirror of an output of the first optical emission port is offset relative to an output of the second optical emission port by a pi phase shift.

2. The monolithically integrated laser according to claim 1, wherein the internal light bending section comprises curved waveguide in the form of a U-shape or a similar shape to result in a bend of approximately 180 degrees.

3. The monolithically integrated laser according to claim 1, wherein the internal light bending section comprises a set of total internal reflection (TIR) mirrors combined with horizontally and vertically oriented waveguides to result in a bend of approximately 180 degrees.

4. The monolithically integrated laser according to claim 1, wherein the first and second optical emission ports of the integrated dual optical emission port laser make efficient use of generated optical emissions than a single output laser in communicating with devices with approximately balanced optical power output.

5. The monolithically integrated laser according to claim 1, wherein a wavelength distance difference from the integrated dual optical emission port laser having the first optical emission and the second optical emission results in a differential phase shift between the two arm paths of the modulator.

6. The monolithically integrated laser according to claim 1, wherein the integrated dual optical emission port laser is tuned with tunable mirrors and the reflection characteristics of both mirrors are measurable at an output of the modulator.

7. The monolithically integrated laser according to claim 1, wherein an angled waveguide is used to minimize reflections at an optical emission facet and reduce requirements of an anti-reflection coating at the first or second optical emission port.

8. The monolithically integrated laser according to claim 1, wherein the integrated dual optical emission port laser comprises a tunable reasonable ring laser.

9. The monolithically integrated laser according to claim 1, wherein the integrated dual optical emission port laser comprises a Y-laser.

10. The monolithically integrated laser according to claim 1, wherein the integrated dual emission port comprises two amplitude and phase locked tunable lasers.

11. The monolithically integrated laser according to claim 1, wherein mirrors of the first optical emission port and the second optical emission port are controlled such that widths of reflection bandwidth are substantially equal for the mirrors.

12. The monolithically integrated laser according to claim 1, wherein the pi phase shift comprises a half wavelength placement shift of the first optical emission port with respect to the second optical emission port, without a phase tuning element or use of s-bends.

13. The monolithically integrated laser according to claim 1, wherein the modulator comprises a half Mach-Zehnder Interferometer (MZI) modulator.

14. A coherent transmitter comprising:

an integrated dual optical emission port laser having a first optical emission port and a second optical emission port;

an internal bending section configured to bend light from one of the first optical emission port and the second optical emission port into the other, the first optical emission port having a substantially balanced laser output with respect to the second optical emission port; and a first modulator on a first arm path and a second modulator on a second arm path, the first arm path and the second arm path each being configured to have a phase section and a gain section, wherein the first and second modulators are directly coupled to the first optical emission port and the second optical emission port, respectively, without use of an input splitter, and the integrated dual optical emission port laser has a balanced power output, and wherein a mirror of an output of the first optical emission port is offset relative to an output of the second optical emission port by a pi phase shift.

15. A monolithic integrated optical transmitter comprising:

a modulator comprising multiple port modulators in communication with an integrated dual optical emission port laser having a first optical emission port and a second optical emission port, the first optical emission port being directly coupled to a first arm path of the modulator and the second optical emission port being directly coupled to a second arm path of the modulator without use of an input splitter, the first optical emission port having a substantially balanced laser output with respect to the second optical emission port, the two arm paths of the modulator each being configured to have a phase section and a gain section, and the integrated dual optical emission port laser having a balanced power output, wherein a mirror of an output of the first optical emission port is offset relative to an output of the second optical emission port by a pi phase shift.

16. The monolithic integrated optical transmitter according to claim 15, wherein one of the multiple port modulators comprises a coherent nested modulator.

17. The monolithic integrated optical transmitter according to claim 15, wherein the modulator is configured to generate a quadrature phase shift keying (QPSK) optically modulated signal.

18. The monolithic integrated optical transmitter according to claim 15, wherein the modulator is configured to generate a dual polarization QPSK optically modulated signal.

19. The monolithic integrated optical transmitter according to claim 15, wherein the modulator is configured to generate higher order coherent dual polarization or single polarization optically modulated signals.

20. A monolithic integrated optical transmitter comprising:

a monolithically integrated laser, modulator and supporting monitoring and control elements positioned on a mono-crystalline substrate, wherein the mono-crystalline substrate comprises a material selected from a group consisting of InP, InGaAsP, InGaP, GaAs, InGaAs, and Si, wherein the monolithically integrated laser includes a first optical emission port and a second optical emission port, and the modulator includes a first modulator and a second modulator, wherein the monolithically integrated laser further includes a light bending section configured to bend light from one of the first optical emission port and the second optical emission port into the other, the first optical emission port having a substantially balanced laser output with respect to the second optical emission port, wherein the first optical emission port and the second optical emission port are directly coupled to the first modulator via a first arm path of the modulator and the second modulator via a second arm path of the modulator, respectively, without use of an input splitter, the two arm paths of the modulator each being configured to have a phase section and a gain section, wherein the monolithically integrated laser has a balanced power output, and wherein a mirror of an output of the first optical emission port is offset relative to an output of the second optical emission port by a pi phase shift.

21. An optical transmitter comprising:

a hybrid integration of a laser modulator and supporting monitoring and control elements in an integrated platform, the integrated platform comprising materials selected from a group consisting of InP, InGaAsP, InGaP, GaAs, Si, SiN3 and SiO2, wherein the laser modulator includes a first modulator on a first arm path and a second modulator on a second arm path, the first arm path and the second arm path being directly coupled to an integrated dual optical emission port laser having a first optical emission port and a second optical emission port, the two arm paths of the laser modulator each being configured to have a phase section and a gain section, wherein the laser modulator further includes a light bending section configured to bend light from one of the first optical emission port and the second optical emission port into the other, wherein the integrated dual optical emission port laser has a balanced power output, and wherein a mirror of an output of the first optical emission port is offset relative to an output of the second optical emission port by a pi phase shift.

* * * * *